(12) United States Patent
Eadelson

(10) Patent No.: US 12,018,893 B2
(45) Date of Patent: Jun. 25, 2024

(54) EVAPORATOR INCLUDING A POROUS UNIT

(71) Applicant: ZUTA-CORE LTD., Shaar Hanegev (IL)

(72) Inventor: Nahshon Eadelson, Moshav Sde-Avraham (IL)

(73) Assignee: ZUTA-CORE LTD., Shaar Hanegev (IL)

( * ) Notice: Subject to any disclaimer, the term of this patent is extended or adjusted under 35 U.S.C. 154(b) by 9 days.

(21) Appl. No.: 16/761,956

(22) PCT Filed: Nov. 4, 2018

(86) PCT No.: PCT/IL2018/051169
§ 371 (c)(1),
(2) Date: May 6, 2020

(87) PCT Pub. No.: WO2019/087195
PCT Pub. Date: May 9, 2019

(65) Prior Publication Data
US 2021/0180874 A1 Jun. 17, 2021

Related U.S. Application Data

(60) Provisional application No. 62/581,794, filed on Nov. 6, 2017.

(51) Int. Cl.
*F28D 15/00* (2006.01)
*F28D 15/02* (2006.01)
*F28D 15/04* (2006.01)

(52) U.S. Cl.
CPC ....... *F28D 15/0266* (2013.01); *F28D 15/043* (2013.01); *F28D 15/046* (2013.01); *F28D 2015/0291* (2013.01); *F28F 2250/08* (2013.01)

(58) Field of Classification Search
CPC .. F28D 15/0266; F28D 15/043; F28D 15/046; F28D 2015/0291;
(Continued)

(56) References Cited

U.S. PATENT DOCUMENTS 4,182,412 A * 1/1980 Shum .................... F28F 13/187
165/133
4,212,349 A 7/1980 Andros et al.
(Continued)

FOREIGN PATENT DOCUMENTS

CN 1639532 A 7/2005
CN 103496751 A 1/2014
(Continued)

*Primary Examiner* — Travis Ruby
(74) *Attorney, Agent, or Firm* — BROWDY AND NEIMARK, P.L.L.C.

(57) ABSTRACT

An evaporator device is provided, including a chamber including an inlet, an outlet, and a surface, the inlet being configured to direct a liquid coolant into the chamber and the outlet is configured to direct a vapor coolant away from the chamber, and the surface is in thermal communication with the liquid coolant or the vapor coolant, and a porous unit disposed adjacent to the surface, the porous unit being configured to (i) absorb the liquid coolant, (ii) bring the liquid coolant into thermal communication with the surface, (iii) subject the liquid coolant to a phase transition to a vapor coolant, and (iv) direct said vapor coolant away from the surface, wherein the surface and the porous unit are of different materials, and the porous unit is thermally insulating.

9 Claims, 8 Drawing Sheets

(58) Field of Classification Search
CPC .......... F28D 2021/0064; F28F 2250/08; F28F 2255/18; F28F 2255/20; F28F 2245/00; F28F 13/187; F28F 13/185
See application file for complete search history.

(56) References Cited

U.S. PATENT DOCUMENTS

| | | | | |
|---|---|---|---|---|
| 4,917,960 | A * | 4/1990 | Hornberger | C09D 1/00 |
| | | | | 428/550 |
| 5,317,905 | A | 6/1994 | Johnson | |
| 5,839,290 | A | 11/1998 | Nazeri | |
| 6,237,223 | B1 | 5/2001 | McCullough | |
| 2001/0045270 | A1 | 11/2001 | Bhatti et al. | |
| 2003/0159809 | A1 | 8/2003 | Valenzuela | |
| 2004/0123980 | A1* | 7/2004 | Queheillalt | F28D 15/046 |
| | | | | 165/133 |
| 2004/0206477 | A1* | 10/2004 | Kenny | F28F 3/086 |
| | | | | 165/80.4 |
| 2006/0042825 | A1* | 3/2006 | Lu | F28D 15/0266 |
| | | | | 174/252 |
| 2006/0047605 | A1 | 3/2006 | Ahmad | |
| 2007/0124934 | A1* | 6/2007 | Peng | H01L 23/473 |
| | | | | 29/890.03 |
| 2007/0240858 | A1* | 10/2007 | Hou | F28D 15/046 |
| | | | | 165/104.26 |
| 2008/0093058 | A1* | 4/2008 | Kim | H01L 23/427 |
| | | | | 165/133 |
| 2008/0105413 | A1* | 5/2008 | Peng | F28F 3/048 |
| | | | | 165/104.33 |
| 2008/0135207 | A1* | 6/2008 | Fukuoka | H01L 21/67109 |
| | | | | 165/65 |
| 2008/0164010 | A1* | 7/2008 | Kang | F28D 15/046 |
| | | | | 165/104.26 |
| 2008/0283225 | A1* | 11/2008 | Ma | F28D 15/00 |
| | | | | 165/104.33 |
| 2009/0159243 | A1* | 6/2009 | Zhao | F28D 15/046 |
| | | | | 165/104.26 |
| 2009/0269521 | A1* | 10/2009 | Tuma | C23C 26/02 |
| | | | | 428/32.74 |
| 2010/0044018 | A1* | 2/2010 | Furberg | C25D 5/623 |
| | | | | 165/133 |
| 2010/0071879 | A1* | 3/2010 | Hou | F28D 15/046 |
| | | | | 165/104.26 |
| 2011/0203772 | A1* | 8/2011 | Hendricks | F28F 13/185 |
| | | | | 165/104.19 |
| 2012/0312504 | A1* | 12/2012 | Suzuki | F28D 15/0266 |
| | | | | 165/104.21 |
| 2013/0025304 | A1* | 1/2013 | Dorman | F25B 41/22 |
| | | | | 62/126 |
| 2013/0312939 | A1* | 11/2013 | Uchida | H01L 23/427 |
| | | | | 165/104.26 |
| 2014/0238646 | A1* | 8/2014 | Enright | H01L 23/427 |
| | | | | 165/104.21 |
| 2015/0198380 | A1* | 7/2015 | Haj-Hariri | F01D 5/187 |
| | | | | 62/3.2 |
| 2016/0116225 | A1* | 4/2016 | Shoujiguchi | H01L 23/427 |
| | | | | 165/104.25 |
| 2016/0161193 | A1* | 6/2016 | Lewis | B81B 1/00388 |
| | | | | 165/104.26 |
| 2016/0252308 | A1* | 9/2016 | Strehlow | F28D 15/046 |
| | | | | 165/104.26 |
| 2016/0273839 | A1* | 9/2016 | Mori | G21C 15/18 |
| 2017/0023308 | A1* | 1/2017 | Huang | F28D 15/0233 |
| 2017/0122629 | A1* | 5/2017 | Burk | F25B 35/04 |
| 2017/0176114 | A1* | 6/2017 | Kandlikar | F28F 13/187 |
| 2017/0176115 | A1* | 6/2017 | Zhang | F28F 13/187 |
| 2017/0229375 | A1* | 8/2017 | Haj-Hariri | H01L 23/427 |
| 2018/0245863 | A1* | 8/2018 | Kusano | F28F 13/14 |
| 2020/0094322 | A1* | 3/2020 | Van Rooyen | B33Y 10/00 |

FOREIGN PATENT DOCUMENTS

| | | |
|---|---|---|
| CN | 103712498 A | 4/2014 |
| EP | 0013362 A1 | 7/1980 |
| GB | 2405688 A | 10/2003 |
| WO | 2015000044 A1 | 1/2015 |
| WO | 2017115359 A1 | 7/2017 |
| WO | 2018163180 A1 | 9/2018 |
| WO | 2018167773 A1 | 9/2018 |
| WO | 2019021273 A1 | 1/2019 |

\* cited by examiner

Prior Art

EVAPORATOR INCLUDING A POROUS UNIT

CROSS REFERENCE

This application claims priority to U.S. Provisional Application No. 62/581,794, filed on Nov. 6, 2017, which is entirely incorporated herein by reference.

BACKGROUND

As performance of electronics and computers increases heat generation increases. The trend toward ever increasing heat dissipation in microprocessor and amplifier based systems, such as those housed in telecommunication cabinets, server rooms (data center), and Cloud Computing centers, is becoming increasingly critical to the electronics industry. Thus, finding effective thermal solutions is of interest to reduce system costs and to increase performance.

Traditional refrigeration systems for cooling either cool the entire electronic system or the heat-generating components therein. Cooling technologies may be used to cool devices, device clusters, subassemblies, and cabinet or rack levels, all of which are within the original equipment manufacturer's (OEM's) products. Cooling of electric systems and devices may be further complicated because, in many cases, thermal regulation is added after manufacture of electronic systems and devices and are not considered in the system designs by the OEM. Equipment design may utilize the latest software or implement the latest semiconductor technology, but the thermal management architecture is generally relegated to the "later phases" of the new product design. As such, thermal management issues, associated with a designed electronic system, are solved by the use of a secondary cooling or refrigeration system that is arranged in tandem with the electronics system.

SUMMARY

As recognized herein, finding effective thermal solutions for thermal regulation and management of electronic systems may be of interest to reduce cost and provide increased performance. The present disclosure provides cost effective and continuously operating thermal regulation and management of electronic devices or systems. This may be useful, for example, in regulating and maintaining a temperature of a source of thermal energy (e.g., heat source), such as, for example, high power electronic systems and server rooms.

In an aspect, the present disclosure provides an evaporator device, comprising: a chamber comprising an inlet, an outlet, and a surface, where the inlet is configured to direct a liquid coolant into the chamber and the outlet is configured to direct a vapor coolant away from the chamber, and wherein the surface is in thermal communication with the liquid coolant or the vapor coolant; and a porous unit disposed adjacent to the surface, wherein the porous unit is configured to (i) absorb the liquid coolant, (ii) bring the liquid coolant into thermal communication with the surface, (iii) subject the liquid coolant to a phase transition to a vapor coolant, and (iv) direct the vapor coolant away from the surface, wherein the surface and the porous unit are of different materials, and wherein the porous unit is thermally insulating.

In some embodiments, the porous unit has pores with an average cross-sectional dimension of less than or equal to about 1000 micrometers. In some embodiments, a thermal conductivity of the porous unit is less than a thermal conductivity of the surface. In some embodiments, a thermal conductivity of the porous unit is less than or equal to about 1 watt per meters-Kelvin (W/m-K). In some embodiments, a thermal conductivity of the surface is greater than or equal to about 10 W/m-K. In some embodiments, the porous unit is a multilayer porous unit. In some embodiments, a layer of the multi layer porous unit has a different average cross-sectional dimension than another layer of the multilayer porous unit.

In some embodiments, the surface and the porous unit are configured to provide a difference between a nucleate boiling temperature of the liquid coolant and a saturation boiling temperature of the liquid coolant that is less than or equal to about 7° C. In some embodiments, the difference is less than or equal to about 3° C. In some embodiments, the difference is less than or equal to about 1° C. In some embodiments, the surface is a portion of a source of thermal energy. In some embodiments, the porous unit contacts the portion of the source of thermal energy. In some embodiments, the surface is a heat exchange unit. In some embodiments, the heat exchange unit contacts a source of thermal energy. In some embodiments, the heat exchange unit comprises a plurality of fins. In some embodiments, the porous unit is disposed between the plurality of fins. In some embodiments, the porous unit is a plurality of porous units. In some embodiments, the plurality of porous units is disposed between the plurality of fins. In some embodiments, the plurality of fins does not have a microporous coating. In some embodiments, the plurality of fins has a microporous coating. In some embodiments, the porous unit comprises a natural fiber that is heat resistant. In some embodiments, the surface and the porous unit are configured such that vapor nucleation sites form at an interface between the surface and the porous unit. In some embodiments, the porous unit comprises one or more members selected from the group consisting of cellulose, polymer, and natural fiber.

In another aspect, the present disclosure provides a cooling system, comprising: a first channel that is configured to direct a liquid coolant; a second channel that is configured to direct a vapor coolant generated from the liquid coolant; a condenser that is configured to permit the vapor coolant to undergo phase transition to the liquid coolant; and at least one cooling interface in fluid communication with the first channel and the second channel, wherein the at least one cooling interface comprises (i) a coolant inlet configured to direct the liquid coolant from the first channel to at least one porous unit, wherein the at least one porous unit is configured to absorb the liquid coolant and bring the liquid coolant in thermal communication with at least one heat exchange unit that is configured to permit heat to flow from a source of thermal energy to the liquid coolant, which heat subjects the liquid coolant to the phase transition to the vapor coolant; and (ii) a coolant outlet configured to permit the vapor coolant to flow from the at least one heat exchange unit to the second channel.

In some embodiments, the at least one porous unit has pores with an average cross-sectional dimension of less than or equal to about 1000 micrometers. In some embodiments, a thermal conductivity of the at least one porous unit is less than a thermal conductivity of the heat exchange unit. In some embodiments, a thermal conductivity of the porous unit is less than or equal to about 1 watt per meters-Kelvin (W/m-K). In some embodiments, a thermal conductivity of the heat exchange unit is greater than or equal to about 10 W/m-K. In some embodiments, the at least one porous unit is a multilayer porous unit. In some embodiments, a layer of the multilayer porous unit has a different average cross-sectional dimension than another layer of the multilayer porous unit.

In some embodiments, the heat exchange unit and the porous unit are configured to provide a difference between a nucleate boiling temperature of the liquid coolant and a saturation boiling temperature of the liquid coolant that is less than or equal to about 7° C. In some embodiments, the difference is less than or equal to about 3° C. In some embodiments, the difference is less than or equal to about 1° C. In some embodiments, the heat exchange unit contacts a source of thermal energy. In some embodiments, the heat exchange unit comprises a plurality of fins. In some embodiments, the porous unit is disposed between the plurality of fins. In some embodiments, the porous unit is a plurality of porous units. In some embodiments, the plurality of porous units is disposed between the plurality of fins. In some embodiments, the plurality of fins does not have a microporous coating. In some embodiments, the plurality of fins has a microporous coating. In some embodiments, the porous unit comprises a natural fiber that is heat resistant. In some embodiments, the surface and the porous unit are configured such that vapor nucleation sites form at an interface between the surface and the porous unit.

In some embodiments, the system further comprises a flow generator in fluid communication with the first channel or the second channel. In some embodiments, the system is configured to operate at a pressure of less than about 1 atmosphere. In some embodiments, the system is self-regulating. In some embodiments, the system further comprises a pressure regulator in fluid communication with the first channel, the second channel, the condenser, the at least one cooling interface, or any combination thereof. In some embodiments, the pressure regulator is configured to modulate a flow rate of the liquid coolant or the vapor coolant.

In some embodiments, the at least one cooling interface comprises two or more individual cooling interfaces. In some embodiments, the at least one cooling interface comprises two or more cooling interfaces. In some embodiments, the two or more cooling interfaces are connected in series. In some embodiments, the two or more cooling interfaces are connected in parallel. In some embodiments, the at least one cooling interface is in direct contact with the source of thermal energy. In some embodiments, the at least one cooling interface is in indirect contact with the source of thermal energy.

In some embodiments, the system further comprises an orifice in fluid communication with the first channel or the second channel. In some embodiments, the orifice is configure to create a vacuum within the at least one cooling interface. In some embodiments, the system provides on demand cooling in absence of a temperature controller. In some embodiments, the first channel, second channel, condenser, and at least one cooling interface are part of a closed loop fluid flow path. In some embodiments, the closed loop fluid flow path that is configured to operate at a pressure of less than 2 atmospheres. In some embodiments, the porous unit comprises one or more members selected from the group consisting of cellulose, polymer, and natural fiber. In some embodiments, the liquid coolant vaporizes between about 5° C. and about 50° C. In some embodiments, the porous unit comprises one or more members selected from the group consisting of cellulose, polymer, and natural fiber. In some embodiments, the system further comprises an expansion container, one or more splitters, a user interface, a thermocouple, a transmitter, a processor and a memory, or any combination thereof.

In another aspect, the present disclosure provides a cooling system, comprising: a first channel that is configured to direct a liquid coolant; a second channel that is configured to direct a vapor coolant generated from the liquid coolant; a condenser that is configured to permit the vapor coolant to undergo phase transition to the liquid coolant; and at least one cooling interface in fluid communication with the first channel and the second channel, wherein the at least one cooling interface comprises (i) a coolant inlet configured to direct the liquid coolant from the first channel to a plurality of fins, wherein the plurality of fins extend into the at least one cooling interface such that the plurality of fins are configured to come in contact with the liquid coolant or the vapor coolant, wherein the plurality of fins is in thermal communication with at least one heat exchange unit such that the plurality of fins and the at least one heat exchange unit are configured to permit heat to flow from a source of thermal energy to the liquid coolant, which heat subjects the liquid coolant to the phase transition to the vapor coolant; and (i) a coolant outlet configured to permit the vapor coolant to flow from the at least one heat exchange unit to the second channel.

In some embodiments, the system further comprises a flow generator in fluid communication with the first channel or the second channel. In some embodiments, the system is configured to operate at a pressure of less than about 1 atmosphere. In some embodiments, the system is self-regulating. In some embodiments, the system further comprises a pressure regulator in fluid communication with the first channel, the second channel, the condenser, the at least one cooling interface, or any combination thereof. In some embodiments, the pressure regulator is configured to modulate a flow rate of the liquid coolant or the vapor coolant.

In some embodiments, the at least one cooling interface comprises two or more individual cooling interfaces. In some embodiments, the at least one cooling interface comprises two or more cooling interfaces. In some embodiments, the two or more cooling interfaces are connected in series. In some embodiments, the two or more cooling interfaces are connected in parallel. In some embodiments, the at least one cooling interface is in direct contact with the source of thermal energy. In some embodiments, the at least one cooling interface is in indirect contact with the source of thermal energy.

In some embodiments, the system further comprises an orifice in fluid communication with the first channel or the second channel. In some embodiments, the orifice is configure to create a vacuum within the at least one cooling interface. In some embodiments, the system provides on demand cooling in absence of a temperature controller. In some embodiments, the first channel, second channel, condenser, and at least one cooling interface are part of a closed loop fluid flow path. In some embodiments, the closed loop fluid flow path that is configured to operate at a pressure of less than 2 atmospheres. In some embodiments, the liquid coolant vaporizes between about 5° C. and about 50° C. In some embodiments, the system further comprises an expansion container, one or more splitters, a user interface, a thermocouple, a transmitter, a processor and a memory, or any combination thereof. In some embodiments, the plurality of fins is spaced such that, during use, capillary action directs the liquid coolant along a long dimension of the plurality of fins.

In another aspect, the present disclosure provides methods for cooling a heat source, comprising: providing an evaporator device in thermal communication with a heat source, wherein the evaporator device comprises (i) a chamber comprising an inlet, an outlet, and a surface and (ii) a porous unit disposed adjacent the surface, wherein the surface is in thermal communication with a liquid coolant or a vapor coolant, wherein the surface and the porous unit are of different materials, and wherein the porous unit is thermally insulating; directing the liquid coolant into the chamber; using the porous unit to absorb the liquid coolant and bring the liquid coolant into thermal communication with the surface to permit heat to flow from the heat source to the liquid coolant, which heat subjects the liquid coolant to a phase transition to the vapor coolant; using the porous unit to direct the vapor coolant away from the surface to cool the heat source; and directing the vapor coolant away from the chamber.

In some embodiments, the porous unit has pores with an average cross-sectional dimension of less than or equal to about 1000 micrometers. In some embodiments, a thermal conductivity of the porous unit is less than a thermal conductivity of the surface. In some embodiments, a thermal conductivity of the porous unit is less than or equal to about 1 watt per meters-Kelvin (W/m-K). In some embodiments, a thermal conductivity of the surface is greater than or equal to about 10 W/m-K. In some embodiments, the porous unit is a multilayer porous unit. In some embodiments, a layer of the multilayer porous unit has a different average cross-sectional dimension than another layer of the multilayer porous unit.

In some embodiments, the surface and the porous unit provide a difference between a nucleate boiling temperature of the liquid coolant and a saturation boiling temperature of the liquid coolant that is less than or equal to about 7° C. In some embodiments, the difference is less than or equal to about 3° C. In some embodiments, the difference is less than or equal to about 1° C. In some embodiments, the surface is a portion of a source of thermal energy. In some embodiments, the porous unit contacts the portion of the source of thermal energy. In some embodiments, the surface is a heat exchange unit. In some embodiments, the heat exchange unit contacts a source of thermal energy. In some embodiments, the heat exchange unit comprises a plurality of fins. In some embodiments, the porous unit is disposed between the plurality of fins. In some embodiments, the porous unit is a plurality of porous units. In some embodiments, the plurality of porous units is disposed between the plurality of fins. In some embodiments, the plurality of fins does not have a microporous coating. In some embodiments, the plurality of fins has a microporous coating. In some embodiments, the porous unit comprises a natural fiber that is heat resistant. In some embodiments, the surface and the porous unit permit vapor nucleation sites 320 form at the interface between the surface and the porous unit. In some embodiments, the porous unit comprises one or more members selected from the group consisting of cellulose, polymer, and natural fiber. In some embodiments, a pressure in the chamber is less than or equal to about 2 atmospheres. In some embodiments, a pressure in the chamber is less than or equal to about 1 atmosphere.

In another aspect, the present disclosure provides methods for cooling a heat source, comprising: providing a cooling system comprising at least one cooling interface in fluid communication with a first channel, a second channel, and a condenser, wherein the at least one cooling interface comprises a coolant inlet, at least one porous unit, at least one heat exchange unit, and a coolant outlet; directing a liquid coolant from the first channel to the at least one cooling interface; in the at least one cooling interface, using the at least one porous unit to absorb the liquid coolant and bring the liquid coolant into thermal communication with the at least one heat exchange unit to permit heat to flow from a heat source to the liquid coolant, which heat subjects the liquid coolant to a phase transition to a vapor coolant; directing the vapor coolant from the at least one cooling interface through the second channel to the condenser; and subjecting the vapor coolant to a second phase transition to form the liquid coolant.

In some embodiments, the method further comprises activating a flow generator to direct flow of the liquid coolant and the vapor coolant. In some embodiments, the liquid coolant is directed to the at least one cooling interface when a temperature of the heat source exceeds a threshold. In some embodiments, the method further comprises directing the liquid coolant to the first channel. In some embodiments, the cooling system dissipates greater than or equal to 300 watts per square centimeters of heat.

In some embodiments, the at least one porous unit has pores with an average cross-sectional dimension of less than or equal to about 1000 micrometers. In some embodiments, a thermal conductivity of the at least one porous unit is less than a thermal conductivity of the heat exchange unit. In some embodiments, a thermal conductivity of the porous unit is less than or equal to about 1 watt per meters-Kelvin (W/m-K). In some embodiments, a thermal conductivity of the heat exchange unit is greater than or equal to about 10 W/m-K. In some embodiments, the at least one porous unit is a multilayer porous unit. In some embodiments, a layer of the multilayer porous unit has a different average cross-sectional dimension than another layer of the multilayer porous unit.

In some embodiments, the heat exchange unit and the porous unit provide a difference between a nucleate boiling temperature of the liquid coolant and a saturation boiling temperature of the liquid coolant that is less than or equal to about 7° C. In some embodiments, the difference is less than or equal to about 3° C. In some embodiments, the difference is less than or equal to about 1° C. In some embodiments, the heat exchange unit contacts a source of thermal energy. In some embodiments, the heat exchange unit comprises a plurality of fins. In some embodiments, the porous unit is disposed between the plurality of fins. In some embodiments, the porous unit is a plurality of porous units. In some embodiments, the plurality of porous units is disposed between the plurality of fins. In some embodiments, the plurality of fins does not have a microporous coating. In some embodiments, the plurality of fins has a microporous coating. In some embodiments, the porous unit comprises a natural fiber that is heat resistant. In some embodiments, the surface and the porous unit permit vapor nucleation sites 320 form at the interface between the surface and the porous unit.

In some embodiments, the method further comprises a flow generator in fluid communication with the first channel or the second channel. In some embodiments, the method operates at a pressure of less than about 1 atmosphere. In some embodiments, the method is self-regulating. In some embodiments, the method further comprises providing a pressure regulator in fluid communication with the first channel, the second channel, the condenser, the at least one cooling interface, or any combination thereof. In some embodiments, the pressure regulator is configured to modulate a flow rate of the liquid coolant or the vapor coolant.

In some embodiments, the at least one cooling interface comprises two or in more individual cooling interfaces. In some embodiments, the at least one cooling interface comprises two or more cooling interfaces. In some embodiments, the two or more cooling interfaces are connected in series. In some embodiments, the two or more cooling interfaces are connected in parallel. In some embodiments, the at least one cooling interface is in direct contact with the source of thermal energy. In some embodiments, the at least one cooling interface is in indirect contact with the source of thermal energy.

In some embodiments, the method further comprises providing an orifice in fluid communication with the first channel or the second channel. In some embodiments, the orifice is configure to create a vacuum within the at least one cooling interface. In some embodiments, the method provides on demand cooling in absence of a temperature controller. In some embodiments, the first channel, second channel, condenser, and at least one cooling interface are part of a closed loop fluid flow path. In some embodiments, the closed loop fluid flow path that is configured to operate at a pressure of less than 2 atmospheres. In some embodiments, the porous unit comprises one or more members selected from the group consisting of cellulose, polymer, and natural fiber. In some embodiments, the liquid coolant vaporizes between about 5° C. and about 50° C. In some embodiments, the porous unit comprises one or more members selected from the group consisting of cellulose, polymer, and natural fiber. In some embodiments, the system further comprises an expansion container, one or more splitters, a user interface, a thermocouple, a transmitter, a processor and a memory, or any combination thereof.

In another aspect, the present disclosure provides methods for cooling, comprising: providing a cooling system comprising at least one cooling interface in fluid communication with a first channel, a second channel, and a condenser, wherein the at least one cooling interface comprises a coolant inlet, a plurality of fins, at least one heat exchange unit, and a coolant outlet, wherein the plurality of fins extend into the at least one cooling interface such that the plurality of fins come in contact with a liquid coolant or a vapor coolant, and wherein the plurality of fins is in thermal communication with the at least one heat exchange unit; directing the liquid coolant from the first channel to the at least one cooling interface; in the at least one cooling interface, using the plurality of fins and the at least one heat exchange unit to permit heat to flow from a heat source to the liquid coolant, which heat subjects the liquid coolant to a phase transition to the vapor coolant; directing the vapor coolant from the at least one cooling interface through the second channel to the condenser; and subjecting the vapor coolant to a second phase transition to form the liquid coolant.

In some embodiments, the method further comprises activating a flow generator to direct flow of the liquid coolant and the vapor coolant. In some embodiments, the liquid coolant is directed to the at least one cooling interface when a temperature of the heat source exceeds a threshold. In some embodiments, the method further comprises directing the liquid coolant to the first channel. In some embodiments, the cooling system dissipates greater than or equal to 300 watts per square centimeters of heat.

In some embodiments, the method further comprises providing a flow generator in fluid communication with the first channel or the second channel. In some embodiments, the method is operated at a pressure of less than about 1 atmosphere. In some embodiments, the method is self-regulating. In some embodiments, the method further comprises providing a pressure regulator in fluid communication with the first channel, the second channel, the condenser, the at least one cooling interface, or any combination thereof. In some embodiments, the pressure regulator is configured to modulate a flow rate of the liquid coolant or the vapor coolant.

In some embodiments, the at least one cooling interface comprises two or more individual cooling interfaces. In some embodiments, the at least one cooling interface comprises two or more cooling interfaces. In some embodiments, the two or more cooling interfaces are connected in series. In some embodiments, the two or more cooling interfaces are connected in parallel. In some embodiments, the at least one cooling interface is in direct contact with the source of thermal energy. In some embodiments, the at least one cooling interface is in indirect contact with the source of thermal energy.

In some embodiments, the method further comprises providing an orifice in fluid communication with the first channel or the second channel. In some embodiments, the orifice is configure to create a vacuum within the at least one cooling interface. In some embodiments, the method provides on demand cooling in absence of a temperature controller. In some embodiments, the first channel, second channel, condenser, and at least one cooling interface are part of a closed loop fluid flow path. In some embodiments, the closed loop fluid flow path that is configured to operate at a pressure of less than 2 atmospheres. In some embodiments, the liquid coolant vaporizes between about 5° C. and about 50° C. In some embodiments, the method further comprises providing an expansion container, one or more splitters, a user interface, a thermocouple, a transmitter, a processor and a memory, or any combination thereof. In some embodiments, the plurality of fins is spaced such that, during use, capillary action directs the liquid coolant along a long dimension of the plurality of fins.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 1A illustrates an air-based thermal regulation system; FIG. 1B illustrates a liquid-based thermal regulation system;

FIG. 3A schematically illustrates a top view of an example cooling interface with a porous unit; FIG. 3B schematically illustrates a side view of an example cooling interface with a porous unit; FIG. 3C schematically illustrates a porous unit disposed adjacent to a heat spreader; FIG. 3D schematically illustrates a porous unit disposed adjacent to a source of thermal energy;

FIG. 4A schematically illustrates an example cooling system with a single inlet and single outlet shut-off valve regulating a single cooling interface; FIG. 4B schematically illustrates a cooling system with a single inlet shut-off valve and single outlet shut-off valve regulating multiple cooling interfaces;

FIG. 5A shows an example cooling interface with an inlet shut-off valve; FIG. 5B schematically illustrates an example cooling interface with inlet and outlet shut-off valves.

DETAILED DESCRIPTION

Figure 1A:
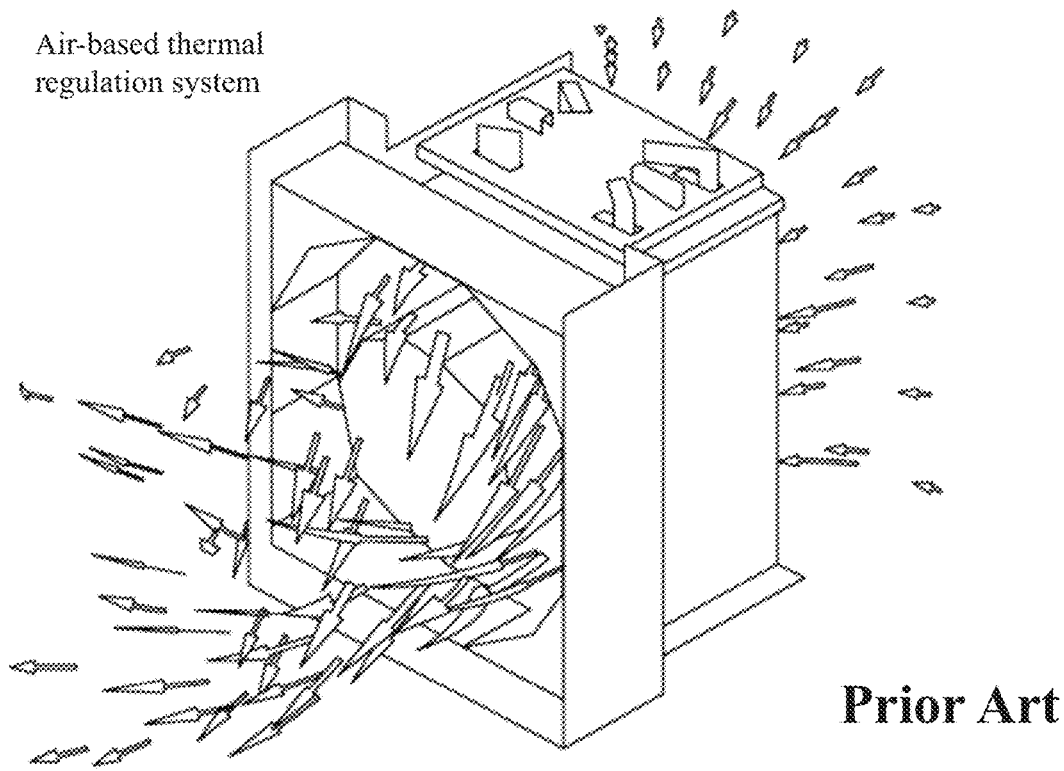
FIGS. 1A and 1B illustrate example single phase thermal regulation systems.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

As used herein, the term "condenser" generally refers to any device in which a vapor coolant is condensed to form a liquid coolant. The condenser may subject a vapor to undergo a phase change (or transition) to a liquid (i.e., condensation). For example, the condenser may condense a vapor coolant to a liquid coolant by altering the temperature of the coolant or the pressure of an environment containing the coolant. Heat removed from the coolant may be stored within the condenser or transmitted from the condenser, such as emitted from the condenser (e.g., using heat fins). Heat may be emitted to the surrounding free air environment of may be transferred to another heating, cooling, or thermal energy transfer device. The transfer of thermal energy may be achieved actively (e.g., by a fan attached to the condenser).

As used herein, the term "cooling interface" generally refers to any device that may absorb heat from a heat source (e.g., an electronic component). The cooling interface may be an evaporator device (e.g., device that conducts heat from a source of thermal energy to a coolant) and may comprise a heat exchange unit, heat spreader, or other thermally conductive material. A cooling interface may be in direct contact with a heat source or indirect contact with a heat source (e.g., via an interface, mediator, or other heat conducting method, such as cooling pipes).

As used herein, the term "fluid" generally refers to a liquid or a gas. A fluid may not maintain a defined shape and may flow during an observable time frame to fill a container in which it is put. Thus, the fluid may have any suitable viscosity that permits flow. If two or more fluids are present, each fluid may be independently selected among essentially any fluid (liquids, gases, and the like).

As used herein, the term "coolant" generally refers to a substance, such as a liquid or a vapor (e.g., gas), that may be used to reduce, increase, or regulate the temperature of a heat source. The coolant can either maintain a phase or may undergo a phase transition during cooling, heating, or temperature regulation. In an example, the coolant may undergo a phase transition from a liquid phase to a gas phase to increase the cooling efficiency of the coolant.

As used herein, the term "channel" generally refers to a feature on or in a device or system that may at least partially direct flow of a fluid. A channel may have any cross-sectional shape (e.g., circular, oval, triangular, irregular, square, rectangular, etc.). A channel may be of any suitable length. The channel may be straight, substantially straight, or may contain one or more bends, curves, or branches.

As used herein, the term "flow generator" generally refers to a mechanism for directing fluid through a channel. The flow generator may be a pump(s), a compressor(s), an educator or any other device that directs the flow of a fluid (e.g., liquid or vapor coolant). The flow generator may direct fluid flow in a pressurized, atmospheric, or vacuum system. In an example, the flow generator generates a vacuum in the system that facilitates fluid flow. The vacuum may be at a pressure of less than about 1 atmosphere (atm), or less than or equal to about 0.9 atm, 0.8 atm, 0.7 atm, 0.6 atm, 0.5 atm, 0.1 atm, 0.01 atm, 0.001 atm, or less.

As used herein, the term "porous unit" generally refers to a component or material that permits the formation of gas nuclei in a coolant undergoing phase transition. The porous unit may increase the phase transition rate (e.g., may permit fluid to transition from a liquid to a gas more quickly). Increasing the rate of phase transition may increase the rate of cooling of a source of thermal energy that is in thermal communication with the porous unit. A porous unit may include a component or material that facilitates capillary action or wicking of the fluid. The porous unit may include one or more of a cloth, wick, sponge, natural fiber, or a polymer. The porous unit may comprise a material that is capable of withstanding heat. The porous unit may be in direct contact with the source of thermal energy or may be separated from the source of thermal energy by a heat spreader.

As used herein, the term "fin" or "fins," which may be used interchangeably, generally refers to a component capable of conducting thermal energy. The fins may be an integrated portion of the cooling interface or may be a standalone component of the cooling system. The fin may be in thermal communication with a source of thermal energy and the coolant. The fins may be mounted on or attached to a heat exchange unit or other interface of the cooling interface. The fins may extend into the cooling interface such that the fins are in part in contact with a liquid or vapor phase coolant. The fin may include one or more surfaces that extend from an object to increase the rate of heat transfer to or from the object (e.g., via convective and/or conductive heat transfer). The fin may facilitate the transfer of heat from a source of thermal energy to the coolant. A fin may be any shape and may extend any distance into the cooling interface. The fins may be spaced sufficiently far apart such that one or more materials may be disposed between the fins. Alternatively or in addition to, the fins may be spaced such that capillary action draws liquid coolant through the spacing during evaporation. The fins may increase transfer of heat from the source of thermal energy to the coolant.

As used herein, the term "nucleate boiling temperature," generally refers to a surface temperature at which nucleate boiling occurs. For example, the nucleate boiling temperature is the surface temperature at which vapor coolant forms on a surface (e.g., surface of a heat exchange unit, heat emitting object, fin, etc.). The temperature at a surface (surface temperature) at which a fluid undergoes nucleate boiling (nucleate boiling temperature) may be greater than the temperature at which the fluid undergoes saturation or bulk boiling (saturation boiling temperature). Under nucleate boiling, the surface temperature may be at least about 1° C., 2° C., 3° C., 4° C., 5° C., 6° C., 7° C., 8° C., 10° C., 20° C., or more greater than the saturation boiling temperature. For water, for example, nucleate boiling may occur when the surface temperature is higher than the saturation boiling temperature by between 10° C., (18° F.) to 30° C. (54° F.) at about 1 atmosphere (atm).

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

The present disclosure provides systems and methods for heat exchange. Systems and methods of the present disclosure may be employed for use in various settings, such as for use in heat exchange with electronic systems (e.g. computer processors, computer servers, data centers, or network systems), energy storage systems (e.g., solid state batteries), charging systems, three dimensional (3D) printing systems, manufacturing systems, and wearable devices.

Thermal Regulation and Transfer of Thermal Energy

The present disclosure provides thermal management systems for regulating the temperature of electronic systems, heat-generating components thereof, and other heat generating systems (e.g., energy storage devises, three dimensional printing devices, etc.

Thermal management or thermal regulation of electronic devices, including servers, central processing units (CPU), and graphics processing units (GPU), may increase the efficiency, longevity, and performance of such devices. Systems and methods for thermal regulation and transfer of thermal energy may include passive thermal regulation and active thermal regulation. Passive thermal regulation may include thermal regulation that does not use additional energy to provide thermal regulation. For example, passive thermal regulation of a device may include incorporating design features into the device that increase dissipation of thermal energy, such as heat sinks, heat spreaders, and heat pipes.

Active thermal regulation may include thermal regulation that uses additional energy to augment the thermal regulation process. Heat pumping thermal regulation may be achieved by material phase change, from liquid to gas, or by electro-cooling which may be highly inefficient. In some examples, the active thermal regulation may be provided by an external device (e.g., a fan). Methods of active thermal management may include forced air cooling, forced liquid cooling, solid-state heat pumps, electro-cooling and multi-phase cooling. Current active thermal regulation systems and methods, such as the phase change cooling in refrigeration and air-conditioning systems, may employ forced condensation through pressurizing gas to at least about 10 atm and evaporating the gas during pressure decrease to below about 3 atm. Such systems, however, may be limited by the high pressure working volume, size, rigidity, and form factor of the required pressure vessel.

Figure 1B:
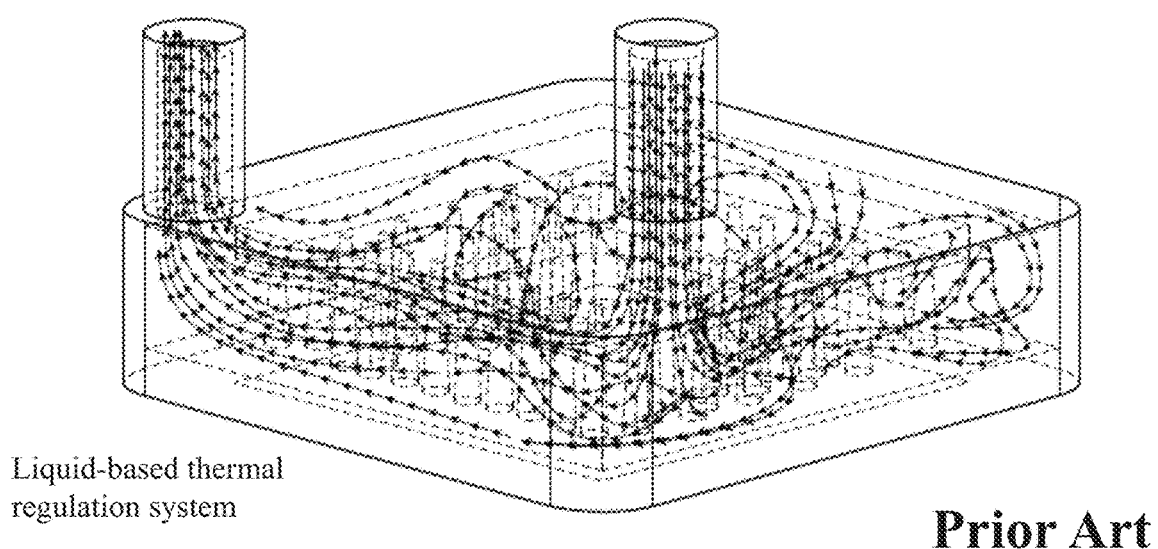

FIGS. 1A and 1B illustrate examples of single phase thermal regulation systems using a forced fluid. FIG. 1A shows an air-based thermal regulation system and FIG. 1B shows a liquid-based thermal regulation system. Single phase, force fluid (e.g., liquid or gas) thermal regulation systems may have limited cooling capabilities due to the ambient temperature in which the system operates. For example, an air-based single phase cooling system may not be capable of cooling a source of thermal energy below the ambient temperature due to the rate of heat transfer being proportional to the temperature gradient, as defined by Fourier's law. Thermal regulation systems may use cooled or chilled fluids to achieve cooling below ambient temperatures. The use of chilled fluids may inefficient as compared to a multiphase thermal regulation system.

Multiphase thermal regulation systems may use latent heat from a phase transition (e.g., from liquid to vapor) to cool below ambient temperatures. A multiphase thermal management system may be a two phase thermal regulation system. Multiphase thermal regulation systems may be high pressure systems or low pressure systems. High pressure systems may be operated at pressures above about 3 atmospheres (atm). High pressure systems may include a gas or vapor that undergoes forced condensation (e.g., using pressures greater than 10 atm) followed by evaporation via a pressure decrease (e.g., using pressures less than about 3 atm). The evaporation process may occur adjacent to a source of thermal energy and the latent heat used to convert the fluid from a liquid to a vapor may draw thermal energy from the source of thermal energy and, therefore, cool the source of thermal energy. High pressure multiphase thermal regulation systems may have a large form factor, use ridged materials, and have robust sealing mechanism due to the high pressure (e.g., greater than 10 atm) of the system.

Figure 2:
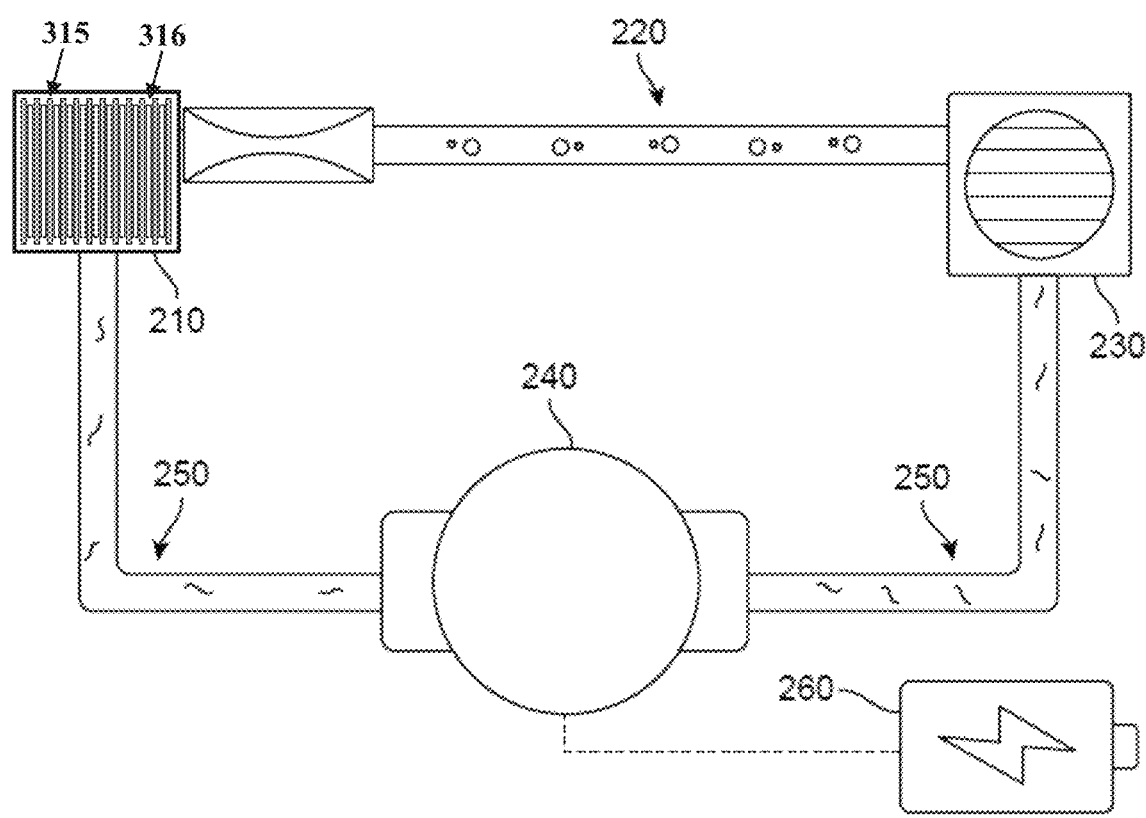
FIG. 2 illustrates an example low pressure, multiphase thermal regulation system.

Low pressure thermal regulation system may use forced evaporation as an alternative to forced condensation. Vacuum (e.g., to achieve a pressure below 1 atm) may be applied to a liquid when the liquid is in contact with or in thermal communication with a source of thermal energy. The transfer of thermal energy from the source to the fluid (e.g., coolant) may cause the liquid to undergo phase transition to a vapor. The transition from liquid to vapor may draw thermal energy from the source of thermal energy and, therefore, cool the source of thermal energy. FIG. 2 shows an example low pressure multiphase thermal regulation system comprising a closed loop fluid flow path. The example low pressure thermal regulation system comprises a cooling interface 210. The cooling interface 210 may be in contact with or in thermal communication with a source of thermal energy. A liquid coolant 250 may enter the cooling interface 210 and, upon transfer of thermal energy from the source of thermal energy, may undergo a phase change to a vapor coolant 220. The vapor coolant 220 may be directed from the cooling interface 210 to a condenser 230. The condenser may enable the vapor coolant 220 to emit heat and phase transition to the liquid coolant 250, thus regenerating the liquid coolant 250. The system may include a vacuum or flow generator 240 to control and direct the flow of the liquid coolant 250. The vacuum or flow generator 240 may include a power supply 260 that powers the flow generator 240. The vacuum flow generator 240 may generate pressures less than or equal to 2 atmosphere (atm), 1.5 atm, 1 atm, 0.8 atm, 0.6 atm, 0.4 atm, 0.2, atm, 0.1 atm, or less.

The rate of cooling of a low pressure thermal regulation system may be dependent upon the pressure of the system, the flow rate of the coolant, the boiling point of the coolant, the temperature gradient between the coolant and the source of thermal energy, and the thermal conductivity between the source of thermal energy and the coolant. As the amount of vacuum is increased (e.g., the pressure of the system is reduced) the boiling point of the liquid coolant may decrease. As the amount of vacuum is decreased (e.g., the system becomes pressurized) the boiling point of the liquid coolant may increase. A liquid coolant that is in thermal communication with a heat source may undergo a temperature transition from the ambient temperature of the liquid coolant to the boiling point of the liquid coolant. As thermal energy continues to transfer to the liquid coolant, the liquid coolant may undergo a phase transition to a vapor coolant. The vapor coolant may continue to increase in temperature as thermal energy transfers from the heat source (e.g., source of thermal energy) to the vapor coolant. Thermal energy may be transferred from the source to the coolant during the changes in temperature of the coolant and the phase transition, however, the transfer of thermal energy may be more efficient during the phase transition than during the temperature change of the coolant. Thus, applying a vacuum to multiphase thermal regulation system may lower the boiling point of a liquid coolant and result in more efficient cooling of a source of thermal energy. Low pressure systems for thermal regulation are further described in PCT/IL2016/051384, PCT/IL2018/050280, PCT/IL2018/050269, and PCT/IL2018/050809 each of which is entirely incorporated herein by reference.

Systems for Cooling a Heat Source

In an aspect, the present disclosure provides devices for heat transfer. An evaporator device may include a chamber and a porous unit. The chamber may include an inlet, an outlet, and/or a surface. The surface may be in thermal communication with a liquid coolant, a vapor coolant, or both a liquid coolant and a vapor coolant. The inlet may be configured to direct a liquid coolant to the chamber. The outlet may be configured to direct a vapor coolant away from the chamber. In an example, the surface is in contact with the liquid coolant, vapor coolant, or both the liquid coolant and the vapor coolant. The porous unit may be disposed adjacent to the surface. The porous unit may be in contact with the surface. The porous unit may be configured to absorb the liquid coolant, bring the liquid coolant into thermal communication with the surface, subject the liquid coolant to a phase transition to a vapor coolant, direct the vapor coolant away from the surface, or any combination thereof. The surface and the porous unit may comprise or be made of different materials. The porous unit may be thermally insulating. The surface and porous unit may be configured (e.g., the porous unit has a porosity and/or the surface and the porous unit have thermal conductivities) such that a difference between a temperature at which the liquid coolant undergoes nucleate boiling (nucleate boiling temperature) and a temperature at which the liquid undergoes saturation or bulk boiling (saturation boiling temperature) is less than or equal to about 7° C.

In another aspect, the present disclosure provides systems for cooling a heat source. The systems may comprise a closed loop fluid flow path. In some examples, the closed loop system may not be open to ambient pressure (e.g., is hermetically sealed). The fluid flow path may be at least in part under vacuum. The fluid flow path may include a first channel, a second channel, a condenser, and at least one cooling interface. The first channel (e.g., first fluid flow path) may be configured to direct a liquid coolant. The second channel (e.g., second fluid flow path) may be configured to direct a vapor coolant generated from the liquid coolant. The condenser may be configured to permit the vapor coolant to undergo a phase transition to the liquid coolant. The cooling interface may be in fluid communication with the first channel and the second channel. The cooling interface may include a coolant inlet, a heat exchange unit, a porous unit, and a coolant outlet. The porous unit may absorb liquid coolant and bring the liquid coolant into thermal communication with the heat exchange unit. The heat exchange unit may permit heat to flow from a source of thermal energy to the liquid coolant to permit the liquid coolant to undergo phase transition to the vapor coolant. The coolant outlet may direct vapor coolant to flow from the at heat exchange unit to the second channel.

In another aspect, the present disclosure provides systems for cooling a heat source. The systems may comprise a closed loop fluid flow path. The closed loop fluid flow path may be at least in part under vacuum. In some examples, the closed loop system is not open to ambient pressure (e.g., is hermetically sealed). The fluid flow path may include a first channel, a second channel, a condenser, and at least one cooling interface. The first channel (e.g., first fluid flow path) may be configured to direct a liquid coolant. The second channel (e.g., second fluid flow path) may be configured to direct a vapor coolant generated from the liquid coolant. The condenser may be configured to permit the vapor coolant to undergo a phase transition to the liquid coolant. The cooling interface may be in fluid communication with the first channel and the second channel. The cooling interface may include a coolant inlet, a heat exchange unit, a plurality of fins, and a coolant outlet. The plurality of fins may extend into the cooling interface such that the plurality of fins are in contact, with the liquid, vapor, or both the liquid and vapor coolant. The plurality of fins may be in thermal communication with the heat exchange unit such that the heat exchange unit and the plurality of fins permit heat to flow from a source of thermal energy to the liquid coolant to permit the liquid coolant to undergo phase transition to the vapor coolant. The coolant outlet may direct vapor coolant to flow from the at heat exchange unit to the second channel.

The evaporator device may include a surface, a liquid coolant, a vapor coolant, and a porous unit. In an example, the evaporator device includes a plurality of porous units. The plurality of porous units may be the same type of porous unit (e.g., same material and/or shape) or the plurality of porous units may be different types of porous units (e.g., different materials and/or shapes). The surface and the porous unit may comprise different materials or may be different materials. For example, the surface may be a thermally conductive material such as a metal (e.g., copper, aluminum, steel, brass, etc.), thermally conductive polymer, or other thermally conductive materials and the porous unit may be a thermally insulating (e.g., material with low thermal conductivity) material. The porous unit may directly contact the surface. Nucleation sites may form at locations in which the porous unit contacts the surface.

The porous unit may preferentially increase the formation of nucleation sites on the surface and, therefore, reduce the transition or film boiling (e.g., to increase the cooling efficiency). The vapor formed by nucleate boiling may be directed away from the surface (e.g., of a heat emitting object, heat exchange unit, heat spreader, etc.). Directing the vapor away from the surface may increase the efficiency of the evaporator device as the thermal conductivity of vapor coolant may be less than the thermal conductivity of the liquid coolant (e.g., heat flux from the surface to the coolant may increase). The porous unit may partially or completely isolate the surface from the vapor coolant. The porous unit may be formed of a polymeric material. The porous unit may be formed of, without limitation, cellulose, metal sponge, metal mesh, polymer(s), ceramic, pumice, or natural fiber(s). In some example, the porous unit is a fibrous material, such as a polymeric material (e.g., a polysaccharide, such as cellulose). The porous unit may comprise be a heat tolerant material (e.g., capable of withstanding temperature of at least 200° C.). The porous unit may comprise a material that is substantially different from the surface. The porous unit may comprise a thermally conductive material (e.g., metal mesh or sponge). Alternatively, or in addition to, the porous unit may comprise a material with low thermal conductivity (e.g., cellulose or natural fibers). A porous unit may be a continuous material or may be segments of materials disposed adjacent to one another. A porous unit may comprise a single material or may be a composite material. For example, a porous unit may comprise one type of material adjacent to a heat transfer surface (e.g., heat emitting object, heat exchange unit, or fin) and another type of material away from the heat transfer surface or internal to the porous material.

The porosity of porous material may be tailored during formation or processing of a starting material. For example, for cellulose, polysaccharide-containing fibers are derived from plants that are processed into a pulp and then extruded. The processing parameters of extrusion may be tailored to impart a certain porosity or range of porosities to the porous material.

The porous unit may be thermally insulating (e.g., a non-heating material). Alternatively, or in addition to, the porous unit may be thermally conductive. A thermally insulating porous unit may reduce the flux of heat away from the surface to below the critical heat flux (e.g., heat flux at which a phase change occurs during heating). Reducing the heat flux may permit nucleate boiling in which isolated bubbles form at nucleation sites and separate from the surface. Nucleate boiling may induce fluid mixing near the surface and increase convective heat transfer and heat flux. The thermally insulating porous unit may increase or maintain nucleate boiling which may increase the cooling efficiency of the evaporator device by providing evaporation at the surface of the evaporator device. The nucleate boiling temperature may be the surface temperature. The nucleate boiling temperature may be greater than the saturation temperature (e.g., bulk boiling temperature). The efficiency of the evaporator device may increase as the nucleate boiling temperature becomes closer to the saturation temperature. For example, an evaporator device with a nucleate boiling temperature that is 10° C. greater than the saturation temperature may be less efficient than an evaporator device with a nucleate boiling temperature that is 5° C. greater than the saturation temperature. The surface and porous unit may be configured such that the nucleate boiling temperature is within 10° C., 9° C., 8° C., 7° C., 6° C., 5° C., 4° C., 3° C., 2° C., 1° C., or less degrees of the saturation temperature.

The difference between the nucleate boiling temperature and the saturation temperature may be less than or equal to about 10° C., 9° C., 8° C., 7° C., 6° C., 5° C., 4° C., 3° C., 2° C. 1° C. or less. In an example, the difference between the nucleate boiling temperature and the saturation temperature may be less than or equal to about 7° C. In an example, the difference between the nucleate boiling temperature and the saturation temperature may be less than or equal to about 5° C. In an example, the difference between the nucleate boiling temperature and the saturation temperature may be less than or equal to about 3° C. In an example, the difference between the nucleate boiling temperature and the saturation temperature may be less than or equal to about 2° C. In an example, the difference between the nucleate boiling temperature and the saturation temperature may be less than or equal to about 1° C. In an example, the difference is less than 1° C. The difference between the nucleate boiling temperature and the saturation temperature may be from about 1° C. to 2° C., 1° C. to 3° C., 1° C. to 4° C., 1° C. to 5° C., 1° C. to 6° C., 1° C. to 7° C., 1° C. to 8° C., 1° C. to 9° C., or 1° C. to 10° C. The difference between the nucleate boiling temperature and the saturation temperature may vary with the pressure of the evaporator device. For example, a high pressure (e.g., above 2 atmospheres) may reduce the difference. A low pressure (e.g., less than 2 atmospheres) may increase the difference. In an example, the evaporator device may have a pressure of less than 1 atmosphere and the difference between the nucleate boiling temperature and the saturation temperature may be less than 3° C. or less than 1° C.

The porous unit may have a structure or material properties that permits or accelerates the formation of coolant nucleation (e.g., increases the formation of vapor coolant bubbles). The porous unit may permit the free flow or substantially free flow of vapor coolant. The porous unit may have pores with an average cross-sectional dimension (e.g., diameter) of less than or equal to about 1500 micrometers ($\mu m$), 1250 $\mu m$, 1000 $\mu m$, 750 $\mu m$, 500 $\mu m$, 400 $\mu m$, 300 $\mu m$, 200 $\mu m$, 150 $\mu m$, 100 $\mu m$, 75 $\mu m$, 50 $\mu m$, 40 $\mu m$, 30 $\mu m$, 20 $\mu m$, 10 $\mu m$, or less. The porous unit may have pores with an average cross-sectional dimension (e.g., diameter) of greater than or equal to about 10 $\mu m$, 20 $\mu m$, 30 $\mu m$, 40 $\mu m$, 50 $\mu m$, 75 $\mu m$, 100 $\mu m$, 150 $\mu m$, 200 $\mu m$, 300 $\mu m$, 400 $\mu m$, 500 $\mu m$, 750 $\mu m$, 1000 $\mu m$, 1250 $\mu m$, 1500 $\mu m$, or more. The porous unit may have pores with an average cross-sectional dimension (e.g., diameter) from about 10 $\mu m$ to 20 $\mu m$, 10 $\mu m$ to 30 $\mu m$, 10 $\mu m$ to 40 $\mu m$, 10 $\mu m$ to 50 $\mu m$, 10 $\mu m$ to 75 $\mu m$, 10 $\mu m$ to 100 $\mu m$, 10 $\mu m$ to 150 $\mu m$, 10 $\mu m$ to 200 $\mu m$, 10 $\mu m$ to 300 $\mu m$, 10 $\mu m$ to 400 $\mu m$, 10 $\mu m$ to 500 $\mu m$, 10 $\mu m$ to 750 $\mu m$, 10 $\mu m$ to 1000 $\mu m$, 10 $\mu m$ to 1250 $\mu m$, or 10 $\mu m$ to 1500 $\mu m$. The porous unit may have pores that are monodisperse or polydisperse. For example, the pores may be monodisperse such that a variation in average cross-sectional dimension (e.g., diameter) among the pores is at most about 20%, 15%, 10%, 5%, 4%, 3%, 2%, 1%, or less. The pores of the porous unit may be interconnected such that they form a tortuous fluid flow path from one surface to another. The porous unit may wick the liquid coolant (e.g., via capillary action) along a length of the porous unit. In an example, the porous unit directs coolant along a surface of a heat exchange unit or heat emitting object. In another example, the porous unit directs coolant along a length of a fin.

The porous unit may be thermally insulating or thermally conductive. The thermal conductivity of the porous unit may be less than or equal to about 50 watts (W)/meter (m)-Kelvin (K), 40 W/m-K, 30 W/m-K, 20 W/m-K, 10 W/m-K, 5

W/m-K, 4 W/m-K, 3 W/m-K, 2 W/m-K, 1 W/m-K, 0.5 W/m-K, 0.25 W/m-K, 0.1 W/m-K, or less. In an example, the thermal conductivity of the porous unit is less than or equal to 10 W/m-K. In an example, the thermal conductivity of the porous unit is less than or equal to 5 W/m-K. In an example, the thermal conductivity of the porous unit is less than or equal to 1 W/m-K. The thermal conductivity of the porous unit may be from about 0.1 W/m-K to 0.25 W/m-K, 0.1 W/m-K to 0.5 W/m-K, 0.1 W/m-K to 1 W/m-K, 0.1 W/m-K to 2 W/m-K, 0.1 W/m-K to 3 W/m-K, 0.1 W/m-K to 4 W/m-K, 0.1 W/m-K to 5 W/m-K, 0.1 to 10 W/m-K, 0.1 W/m-K to 20 W/m-K, 0.1 W/m-K to 30 W/m-K, 0.1 Wm-K to 40 W/m-K, or 0.1 W/m-K to 50 W/m-K. The thermally conductivity of the porous unit may be less than the thermal conductivity of the surface. The thermal conductivity of the surface may be greater than or equal to about 10 W/m-K, 20 W/m-K, 30 W/m-K, 40 W/m-K, 50 W/m-K, 60 W/m-K, 80 W/m-K, 100 W/m-K, 120 W/m-K, 150 W/m-K, 200 W/m-K, 250 W/m-K, 300 W/m-K, 400 W/m-K, 500 W/m-K, or more. In an example, the thermal conductivity of the surface is greater than or equal to 10 W/m-K.

The porous unit may be a single layer or multiple layers. The porous unit may have greater than or equal to 1, 2, 3, 4, 6, 8, 10, 12, 15, 20, 25, 30, 40, 50, 75, 100, or more layers. A layer of the porous unit may have pores of the same average cross-sectional dimension (e.g., diameter) as the pores of the other layers of the multilayer porous unit. Alternatively, or in addition to, the multilayer porous unit may have layers with differing average cross-sectional dimensions (e.g., diameters). In an example, a multilayer porous unit may have layers both with pores of the same average cross-sectional dimension (e.g., diameter) and different average cross-sectional dimensions (e.g., diameters). In an example, the average cross-sectional dimensions may vary from about 50 μm to 1500 μm.

The porous unit may be disposed in direct, full or partial, contact with the heat emitting object (e.g., source of thermal energy). Alternatively, or in addition to, the porous unit may be disposed in direct, full, or partial contact with a thermal extension in thermal communication with the heat emitting object. A thermal extension may be the heat exchange unit or a thermally conductive material (e.g., heat sink or heat spreader) disposed between the source of thermal energy and the heat exchange unit. In an example, the surface comprises one or more (e.g., a plurality of) fins and the porous unit is disposed adjacent to the fins. In another example, the surface may not include fins and the porous unit is disposed adjacent to the heat exchanger (e.g., heat spreader). In another example, the heat emitting object may be submerged in the coolant and the porous unit may be disposed adjacent to the heat emitting object (e.g., in direct contact with the heat source).

The surface of the evaporator device may be a heat emitting object (e.g., heat source or source of thermal energy). Alternatively, or in addition to, the surface of the evaporator device may be heat spreader, heat exchange unit, or other thermally conductive material. In an example, the surface is a heat emitting object and the porous unit directly contacts the heat emitting object. The heat emitting object may be a battery. The porous unit may be used with the battery cooling systems and methods described in PCT/IL2018/050269, filed Mar. 8, 2018, which is entirely incorporated herein for all purposes. In another example, the evaporator device is a heat exchange unit or heat spreader and the porous unit directly contacts the heat exchange unit or heat spreader. The heat exchange unit may include fins as described elsewhere herein. The porous unit may be disposed over the fins or may surround the fins. In an example, the evaporator device includes a plurality of fins and porous units and the plurality of porous units are disposed between the fins.

A heat exchange unit may include one or more heat sinks, heat spreaders, or fins that transfer heat from the heat source to the liquid coolant. The heat exchange units may comprise a material with high thermal conductivity, such as, for example, metals (e.g., copper, aluminum, iron, steel, etc.), non-metal conductors (e.g., graphite or silicon), heat transfer fluids, or any combination thereof. The heat exchange unit may be disposed adjacent to a source of thermal energy (e.g., heat source). The heat exchange unit may be an integrated part of the cooling interface or may be separable. The heat exchange unit may be in direct contact with an object to be cooled (e.g., a source of thermal energy). Alternatively, or in addition to, the heat exchange unit may be in indirect contact with the object to be cooled (e.g., may be in contact with a heat conducting material or fluid that is in contact with the object). In an example, the heat exchange unit is in contact with a heat sink that is in contact with the source of thermal energy.

The evaporator device or heat exchange unit may comprise one or more chambers, channels, or fins. At least one surface of the heat exchange unit may have fins, grooves, and/or columns. The heat exchange unit may generate a thin layer of liquid coolant in thermal communication with the heat source. The chamber may be sealed such that coolant may enter and exit the chamber through the coolant inlet and coolant outlet, respectively. The thin layer of coolant may increase the efficiency of cooling. In an example, the heat exchange unit comprises a chamber. The chamber may be a thin chamber such that the liquid coolant forms a thin layer of coolant. The coolant may flow parallel to a long dimension of the chamber. The coolant may be in a liquid phase on one side of the chamber (e.g., near the cooling interface inlet) and a vapor phase on another side of the chamber (e.g., near the cooling interface outlet). In another example, the chamber may not be a thin chamber. The chamber may be configured to allow the liquid coolant to pool in the chamber. The pool of liquid coolant may be disposed on a side of the heat exchange unit disposed adjacent to the source of thermal energy. Alternatively, or in addition to, the source of thermal energy may be disposed in the pool of liquid coolant. The chamber may have a coolant inlet that directs or provides liquid coolant to the chamber. The chamber may have a coolant outlet that directs liquid and/or vapor coolant out of the chamber. The coolant outlet may be disposed below the level of the liquid coolant, at the level of the liquid coolant, or above the level of the liquid coolant. In an example, the coolant outlet is disposed above the level of the liquid coolant such that only vapor coolant passes through the coolant outlet.

The chamber may have a height (e.g., distance perpendicular to the direction of fluid flow) of less than or equal to about 10 centimeters (cm), 8 cm, 6 cm, 5 cm, 4 cm, 3 cm, 2 cm, 1 cm, 0.5 cm, 0.25 cm, or less. The chamber may have a height of greater than or equal to about 0.25 cm, 0.5 cm, 1 cm, 2 cm, 3 cm, 4 cm, 5 cm, 6 cm, 8 cm, 10 cm, or more. The chamber may have a volume of less than or equal to about 4,000 cubic centimeters ($cm^3$), 3,500 $cm^3$, 3,000 $cm^3$, 2,500 $cm^3$, 2,000 $cm^3$, 1,500 $cm^3$, 1,000 $cm^3$, 750 $cm^3$, 500 $cm^3$, 250 $cm^3$, 200 $cm^3$, 150 $cm^3$, 100 $cm^3$, 75 $cm^3$, 50 $cm^3$, 25 $cm^3$, 20 $cm^3$, 15 $cm^3$, 10 $cm^3$, 8 $cm^3$, 6 $cm^3$, 4 $cm^3$, 2 $cm^3$, 1 $cm^3$, 0.5 $cm^3$, or less. The chamber may have a volume of greater than or equal to about 0.5 $cm^3$, 1 $cm^3$, 2 $cm^3$, 4 $cm^3$, 6 $cm^3$, 8 $cm^3$, 10 $cm^3$, 15 $cm^3$, 20 $cm^3$, 25 $cm^3$, 50 $cm^3$, 75 cm³, 100 cm³, 150 cm³, 200 cm³, 250 cm³, 500 cm³, 750 cm³, 1,000 cm³, 1,500 cm³, 2,000 cm³, 2,500 cm³, 3,000 cm³, 3,500 cm³, 4,000 cm³, or more. The heat exchange unit may have a cooling area of greater than or equal to about 0.5 squared centimeters (cm²), 1 cm², 2 cm², 4 cm², 6 cm², 8 cm², 10 cm², 15 cm², 20 cm², 30 cm², 40 cm², 50 cm², 75 cm², 100 cm², 150 cm², 200 cm², 300 cm², 350 cm², 400 cm², or more. The heat sink or heat exchange unit may have a cooling area of less than or equal to 400 cm², 350 cm², 300 cm², 250 cm², 200 cm², 150 cm², 100 cm², 75 cm², 50 cm², 40 cm², 30 cm², 20 cm², 15 cm², 10 cm², 8 cm², 6 cm², 4 cm², 2 cm², 1 cm², 0.5 cm², or less.

The evaporator device may further comprise one or more fins. The fins may extend into the heat transfer or cooling interface device such that the tins contact the coolant. The fins may contact the liquid coolant, vapor coolant, or both the liquid and vapor coolant. The tins may be an integral part of the heat exchange unit (e.g., are connected to the heat exchange unit and/or the heat exchange unit and fins are formed of a single material). Alternatively, or in addition to, the fins may separable from or formed of a separate material from the heat exchange unit. In an example, the fins extend from a surface of the heat exchange unit into the chamber of the heat exchange unit to contact the coolant. An evaporator device (e.g., cooling interface) may include at least 1, 2, 4, 6, 8, 10, 12, 15, 20, 35, 30, 40, 50, 60, 80, 100, or more fins. The fins may be disposed such that a long dimension of the fin (e.g., height of the fin) if substantially perpendicular or perpendicular to a surface of the heat exchange unit in thermal contact with the object to be cooled. The fins may comprise any shape. For example, the fins may be vertically mounted plates, columns, rods, cones, pyramids, or any other shape useful for heat transfer. The fins may be the same shape or the fins within a cooling unit may be multiple shapes. The fins may have smooth surfaces or may include protrusions to increase the surface area of the fin. The fins may or may not have a coating. In an example, the fins do not have a coating. A coating may be a surface treatment or layer that increases a roughness or porosity of the surface of the fin. The height of the fins (e.g., the dimension perpendicular to a surface of the heat exchange unit or extending away from the object to be cooled) may be greater than or equal to about 0.5 mm to 1 mm, 0.5 mm to 2 mm, 0.5 mm to 3 mm, 0.5 mm to 4 mm, 0.5 mm to 5 mm, 0.5 mm to 6 mm, 0.5 mm to 8 mm, 0.5 mm to 10 mm, 0.5 mm to 15 mm, or 0.5 mm to 20 mm. The height of the fins (e.g., the dimension perpendicular to a surface of the heat exchange unit or extending away from the object to be cooled) may be less than or equal to about 20 millimeter (mm), 15 mm, 10 mm, 8 mm, 6 mm, 5 mm, 4 mm, 3 mm, 2 mm, 1 mm, 0.5 mm, or less. The width of the fins (e.g., the dimension parallel to a surface of the heat exchange unit) may be less than or equal to about 10 mm, 8 mm, 6 mm, 5 mm, 4 mm, 3 mm, 2 mm, 1 mm, 750 micrometers (μm), 500 μm, 250 μm, 100 μm, or less. The width of the fins the dimension parallel to a surface of the heat exchange unit) may be greater than or equal to about 100 μm to 250 μm, 100 μm to 500 μm, 100 μm to 750 μm, 100 μm to 1 mm, 100 μm to 2 mm, 100 μm to 3 mm, 100 μm to 4 mm, 100 μm to 5 mm, 100 μm to 6 mm, 100 μm to 8 mm, or 100 μm to 10 mm.

The fins may be disposed such that fluid from the coolant inlet can flow around and surround the fins. At least a portion of the fins may be in contact with the liquid coolant. For example, a lower portion of the fin (e.g., a portion closes to the object to be cooled) may be in contact with the liquid coolant. At least a portion of the fins may be in contact with the vapor coolant. For example, an upper portion of the fin (e.g., a portion furthest from the object to be cooled) may be in contact with the vapor coolant. Liquid coolant may pool around the lower portion of the fins. The heat exchange unit may transfer thermal energy from the object to be cooled to the fins. The fins may transfer thermal energy to the coolant. As the coolant contacts the fins, it may evaporate to form a vapor coolant. The vapor coolant may flow along the long dimension of the fins (e.g., away from the surface of the heat exchange unit in thermal contact with the object to be cooled) to the coolant outlet.

The fins may be shaped and/or disposed to distribute fluid throughout the cooling interface. For example, the fins may be disposed such that gaps between the fins permit coolant to flow. The gaps between the fins may be less than or equal to about 20 millimeter (mm), 15 mm, 10 mm, 8 mm, 6 mm, 5 mm, 4 mm, 3 mm, 2 mm, 1 mm, 0.5 mm, 0.2.5 mm, 0.1 mm, or less. The gaps between the fins may be greater than or equal to about 0.1 mm, 0.25 mm, 0.5 mm, 1 mm, 2 mm, 5 mm, 4 mm, 5 mm, 6 mm, 8 mm, 10 mm, 15 mm, 20 mm, or more. The gaps between the fins may be from about 0.1 mm to 0.25 mm, 0.1 mm to 0.5 mm, 0.1 mm to 1 mm, 0.1 mm to 2 mm, 0.1 mm to 3 mm, 0.1 mm to 4 mm, 0.1 mm to 5 mm, 0.1 mm to 6 mm, 0.1 mm to 8 mm, 0.1 mm to 10 mm, 0.1 mm to 15 mm, or 0.1 mm to 20 mm. The fins may be spaced such that capillary action directs coolant away from a pool of liquid coolant and from the object to be cooled. As the coolant flows along the fin, it may undergo a phase transition from a liquid to a vapor coolant.

Figure 3A:
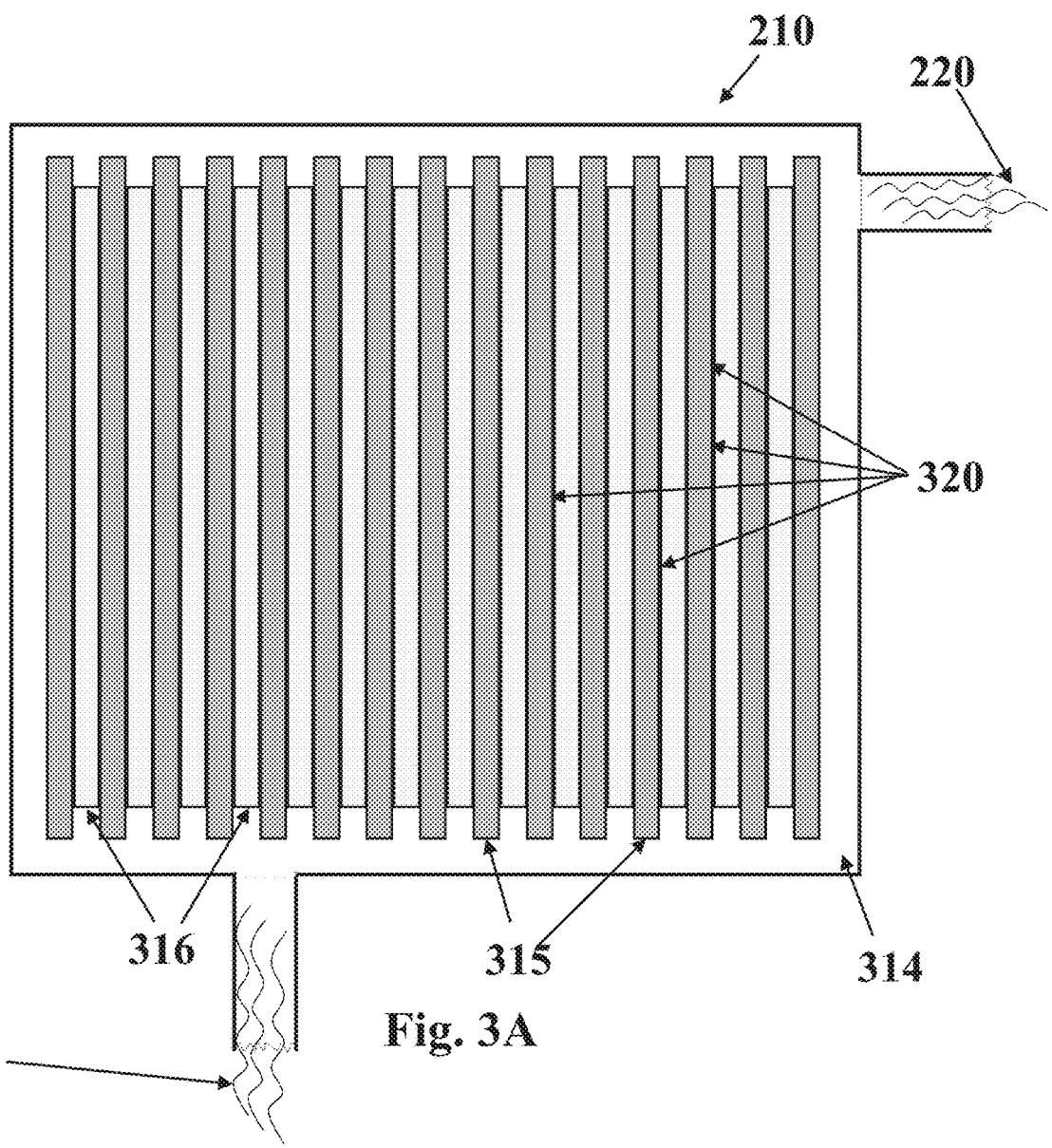
FIGS. 3A-3D schematically illustrate an example cooling interface with a porous unit.
Figure 3B:
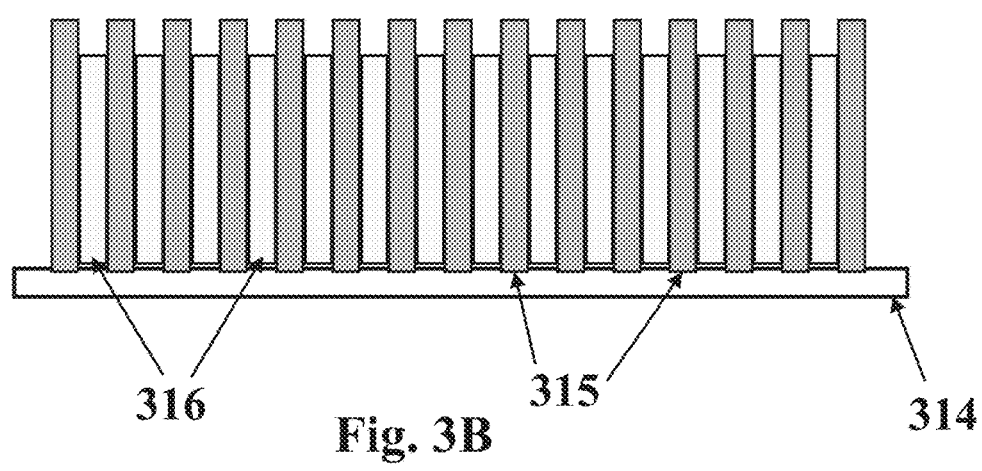

In an example, the evaporator device or cooling interface includes fins. The fins may be in thermal contact with or connected to a heat exchange unit (e.g., a heat spreader or heat sink). The cooling interface may further include on or more porous units. The one or more porous unit may be disposed between the fins, wrapped around the fins, or otherwise in contact with or in close proximity to the fins. In an example, the fins are columns or pins and the porous units are wrapped around the fins (e.g., are a sheath around the fins). In another example, the fins are plates disposed perpendicular to a surface of the heat exchange unit and the porous units are disposed between the plates (e.g., layers of porous units alternate with the fins. FIGS. 3A and 3B schematically illustrate an example fin and porous unit configurations. FIG. 3A shows a top down view of the inside of a cooling interface with a plurality of fins 315, a plurality of porous units 316, and heat exchange unit 314. The plurality of fins 315 and plurality of porous units 316 are arranged such that the fins and porous units alternate across one dimension of the heat exchange unit 314. The heat exchange unit 314 may be a heat spreader. The surface area of the fins 315 and porous units 316 may be less than the surface area of the heat exchange unit 314 such that the coolant can flow around and through the fins. FIG. 3B shows a side view of the of the inside of a cooling interface with a plurality of fins 315, a plurality of porous units 316, and heat exchange unit 314. The fins 315 may have a first dimension (e.g., height) perpendicular to the heat exchange unit 314 and a short dimension (e.g., width) parallel to the heat exchange unit 314. The height of the fins may be greater than the width. Alternatively, or in addition to, the width of the tins may be greater than the height. The porous unit may have similar dimensions to the fins or may have different dimensions. The height of the porous unit (e.g., dimension extending away from the heat emitting object) may be greater than or equal to about 5%, 10%, 15%, 20%, 25%, 30%, 40%, 50%, 60%, 70%, 80%, 90%, 100%, 110%, 120%, 130%, 140%, 150%, or more than the height of the fins. The height of the porous unit (e.g., the dimension extending away from the heat emitting object) may be less than or equal to about 150%, 140%, 130%, 120%, 110%, 100%, 90%, 80%, 70%, 60%, 50%, 40%, 30%, 25%, 20%, 15%, 10%, 5%, or less than the height of the fin. The width of the porous unit (e.g., a small dimension parallel to a surface of the heat exchange unit) may be less than or equal to the gap between the fins. The length of the porous unit (e.g., the long dimension parallel to a surface of the heat exchange unit) may be less than, equal to, or greater than the length of the fins. The length of the porous unit (e.g., the long dimension parallel to a surface of the heat exchange unit) may be greater than or equal to about 5%, 10%, 15%, 20%, 25%, 30%, 40%, 50%, 60%, 70%, 80%, 90%, 100%, 110 120%, 130%, 140%, 150%, or more than the length of the fins. The length of the porous unit (e.g., the long dimension parallel to a surface of the heat exchange unit) may be less than or equal to about 150%, 140%, 130%, 120%, 110%, 100%, 90%, 80%, 70%, 60%, 50%, 40%, 30%, 25%, 20%, 15%, 10%, 5%, or less than the length of the fin. In an example, the length and height dimensions of the porous unit are larger than the length and height dimensions of the fins (e.g., the porous unit extends past the fins in one or more dimensions). The porous unit may wick (e.g., via capillary action) coolant along the height and length of the fins. The coolant may undergo a phase transition from a liquid to a vapor as it progresses along the height of the fins.

Figure 3C:
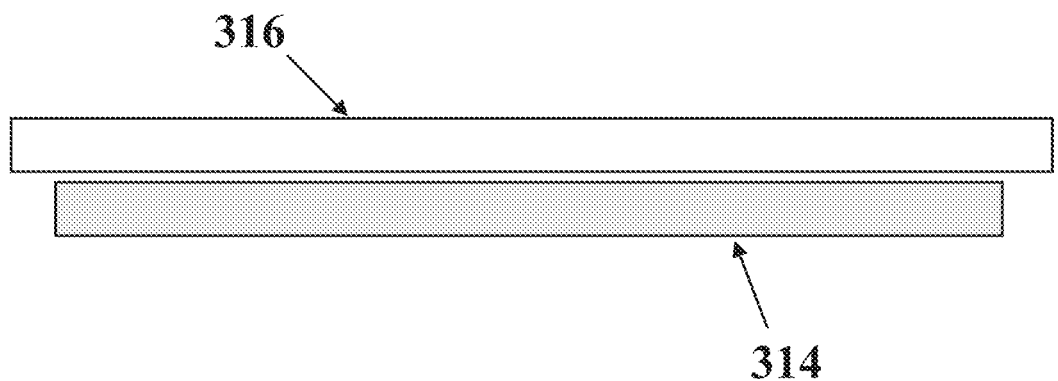

In an example, the cooling interface does not have fins and the porous unit is in contact with the heat exchange unit (e.g., heat spreader). The system may or may not include a porous unit. In a system without a porous unit, nucleation sites may occur on a surface of the heat exchange unit which, in turn, may reduce the rate of heat transfer and cooling. In a system with a porous unit, the porous unit may be in direct contact, partially or fully, with the heat exchange unit. Nucleation may preferentially occur in the porous unit such that the vapor is formed and directed away from a surface of the heat exchange unit, thereby increasing the rate of heat transfer and cooling. FIG. 3C shows an example schematic of a porous unit in 316 in contact with a heat exchange unit 314. The porous unit may direct liquid coolant along a surface of the heat exchange unit and vapor coolant away from the heat exchange unit.

Figure 3D:
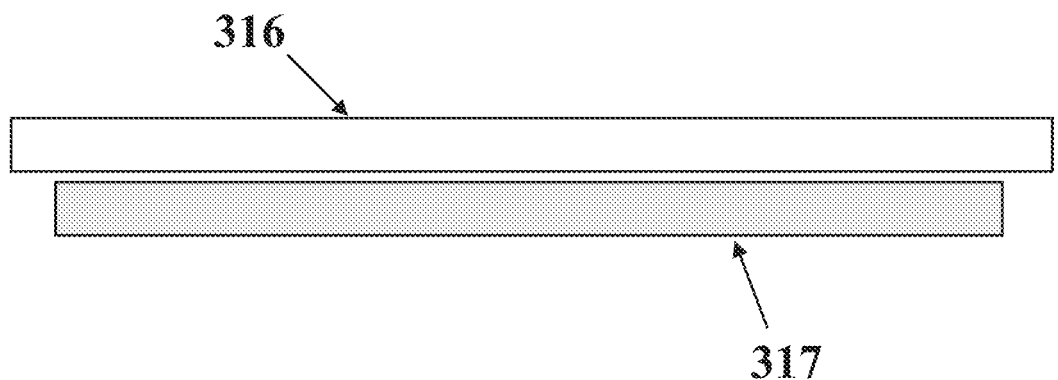

In an example, the heat emitting object (e.g., source of thermal energy) is in direct contact with the coolant (e.g., is submerged in or surrounded by the coolant). The cooling interface may seal around the heat emitting object such that the system is a closed loop system (e.g., hermetically sealed from the ambient environment). The system may or may not include a porous unit. In a system without a porous unit, nucleation sites may occur on a surface of the heat emitting object which, in turn, may reduce the rate of heat transfer and cooling. In a system with a porous unit, the porous unit may be in direct contact, partially or fully, with the heat emitting object. Nucleation may preferentially occur in the porous unit such that the vapor is formed and directed away from a surface of the heat emitting object, thereby increasing the rate of heat transfer and cooling. FIG. 3D shows an example schematic of a porous unit in 316 in contact with a heat emitting object 317. The porous unit may direct liquid coolant along a surface of the heat emitting object and vapor coolant away from the heat emitting object.

The evaporator device may be incorporated into a system. The evaporator device or system may be a high pressure (e.g., pressure greater than or equal to 2 atmospheres (atm)), atmospheric pressure, or low pressure (e.g., pressure less than 2 atm) cooling system. In an example, the cooling system is a low pressure (e.g., vacuum) cooling system. The pressure of the cooling system may be constant throughout the system or may vary throughout the system. For example, the pressure may be greater in the condenser than in the channels or at the cooling interface. The pressure of the system may be less than or equal to about 5 atmospheres (atm), 4 atm, 3 atm, 2 atm, 1.5 atm, 1 atm, 0.8 atm, 0.6 atm, 0.4 atm, 0.2 atm, 0.1 atm, or less. The pressure of the system may be from about 0.1 atm to 0.2 atm, 0.1 atm to 0.4 atm, 0.1 atm to 0.6 atm, 0.1 atm to 0.8 atm, 0.1 atm to 1 atm, 0.1 atm to 1.5 atm, 0.1 atm to 2 atm, 0.1 atm to 3 atm, 0.1 atm to 4 atm, or 0.1 atm to 5 atm. The pressure in the condenser may be greater than or equal to about 0.5 atm, 1 atm, 1.5 atm, 2 atm, 4 atm, 6 atm, 8 atm, 10 atm, or greater. The pressure of the condenser may be from about 0.5 atm to 1 atm, 0.5 atm to 1.5 atm, 0.5 atm to 2 atm, 0.5 atm to 4 atm, 0.5 atm to 6 atm, 0.5 atm to 8 atm, or 0.5 atm to 10 atm. The pressure at the cooling interface may be less than or equal to about 5 atm, 4 atm, 3 atm, 2 atm, 1.5 atm, 1 atm, 0.8 atm, 0.6 atm, 0.4 atm, 0.2 atm, 0.1 atm, or less. The pressure at the cooling interface may be from about 0.1 atm to 0.2 atm, 0.1 atm to 0.4 atm, 0.1 atm to 0.6 atm, 0.1 atm to 0.8 atm, 0.1 atm to 1 atm, 0.1 atm to 1.5 atm, 0.1 atm to 2 atm, 0.1 atm to 3 atm, 0.1 atm to 4 atm, or 0.1 atm to 5 atm. The difference in pressure between the cooling interface and other portions of the system (e.g., condenser, flow generator, channels) may be greater than or equal to about zero atm, 0.1 atm, 0.2 atm, 0.4 atm, 0.6 atm, 0.8 atm, 1 atm, 1.5 atm, 2 atm, 4 atm, 6 atm, 8 atm, 10 atm, or more. The difference in pressure between the cooling interface and other portions of the system (e.g., condenser, flow generator, channels) may be less than or equal to about 10 atm, 8 atm, 6 atm, 4 atm, 2 atm, 1.5 atm, 1 atm, 0.8 atm, 0.6 atm, 0.4 atm, 0.2 atm, 0.1 atm, or less.

The evaporator device or the cooling system may directly absorb heat from at least one heat source by a direct or indirect contact of the cooling interface (e.g., evaporator device) with the heat source (e.g., electronic device). Utilizing latent heat (i.e. liquid vaporization), the cooling system may cool the heat source. Vaporization may be permitted by applying vacuum to the coolant or cooling agent. The vaporized coolant may be transferred to the condenser to be condensed to form a liquid coolant. The condenser may emit the heat absorbed from the heat source into the environment, to another device, and/or to a heat absorbing material. The liquid coolant may then be directed to the vacuum applied component of the apparatus (e.g., the cooling interface or an expansion container). In an example, the cooling interfaces (e.g., evaporator devices) are in direct contact with the heat source. The heat source may be cooled by placing the cooling interfaces in direct or indirect contact (e.g., through a heat conductor) with the heat source.

The heat absorption via a cooling interface may be achieved through liquid coolant vaporization. Vaporization may be achieved by applying vacuum onto the coolant or cooling agent within the cooling interface(s). Alternatively, or in addition to, vaporization may be achieved by allowing the coolant to evaporate and evacuating the gaseous coolant. The evaporated coolant may be removed or taken away from the cooling interface and directed to the condenser. The condenser may condense the vapor coolant to form a liquid coolant. The absorbed heat may be emitted from the condenser to the surrounding environment (e.g., surrounding air) or to another device. The liquid coolant may flow from the condenser to the cooling interface. Alternatively, or in addition to, the liquid coolant may flow from the condenser to a flow generator or other vacuum component of the cooling system.

The system may include a first channel that directs the liquid coolant to the coolant inlet of the cooling interface. The coolant inlet may direct and control the flow of liquid coolant from the coolant inlet and towards the second channel. The coolant inlet may, or may not, comprise an inlet shut-off valve. In an example, the coolant inlet comprises an inlet shut-off valve. The inlet shut-off valve may modulate a level, volume, or amount of liquid coolant within the cooling interface. The coolant outlet may permit the vapor coolant to flow from the cooling interface to the second channel. The coolant outlet may comprise an outlet shut-off valve. The outlet shut-off valve may permit or block the flow of vapor and/or liquid coolant from the cooling interface to the outlet channel. The system may absorb heat from a heat source by vaporizing the liquid coolant into a vapor coolant (e.g., through latent heat). The system may further comprise a plurality of outlet shut-off valves. The outlet shut-off valves may be disposed between the heat exchange unit of the cooling interface and the outlet channel. Alternatively, or in addition two, the outlet shut-off valves may be integrated with the outlet channel and/or or the cooling interface. In an example, the system includes multiple heat exchange units and each outlet shut-off valve controls the flow of fluid from a single heat exchange unit to the outlet channel. In another example, the one outlet shut-off valve controls fluid flow from more than one heat exchange units. The outlet shut-off valve may be a metered valve (e.g., controls the flow rate of the fluid) or may be a discrete valve (e.g., valve comprising an open state and a closed state). The outlet shut-off valve may be designed to allow vapor, liquid, and or vapor and liquid coolant to enter each associated outlet channel which is in fluid communication therewith, while preventing backflow of the vapor and/or liquid coolant.

Figure 4A:
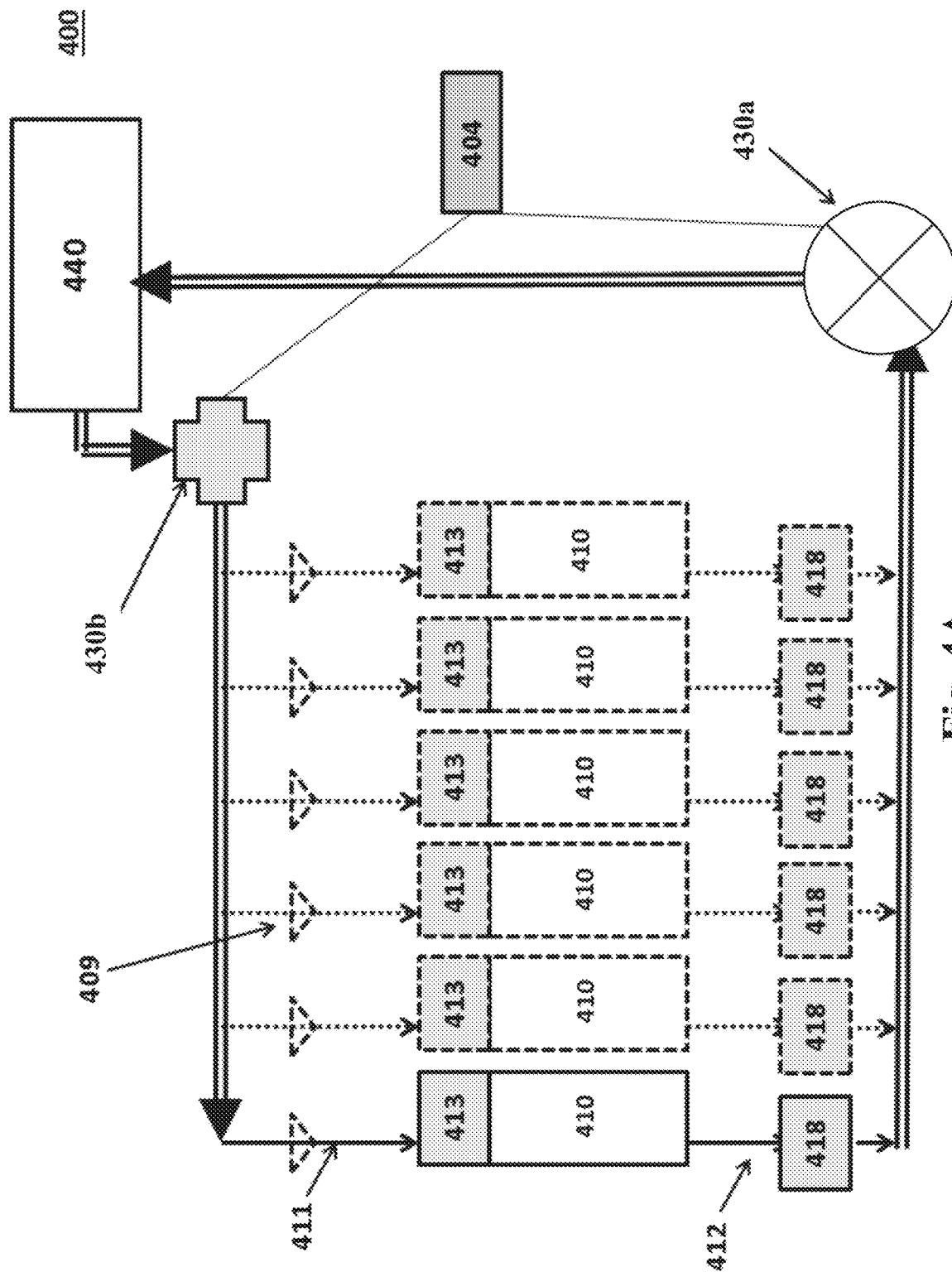
FIGS. 4A and 4B schematically illustrate example cooling systems with one or more cooling interfaces.
Figure 4B:
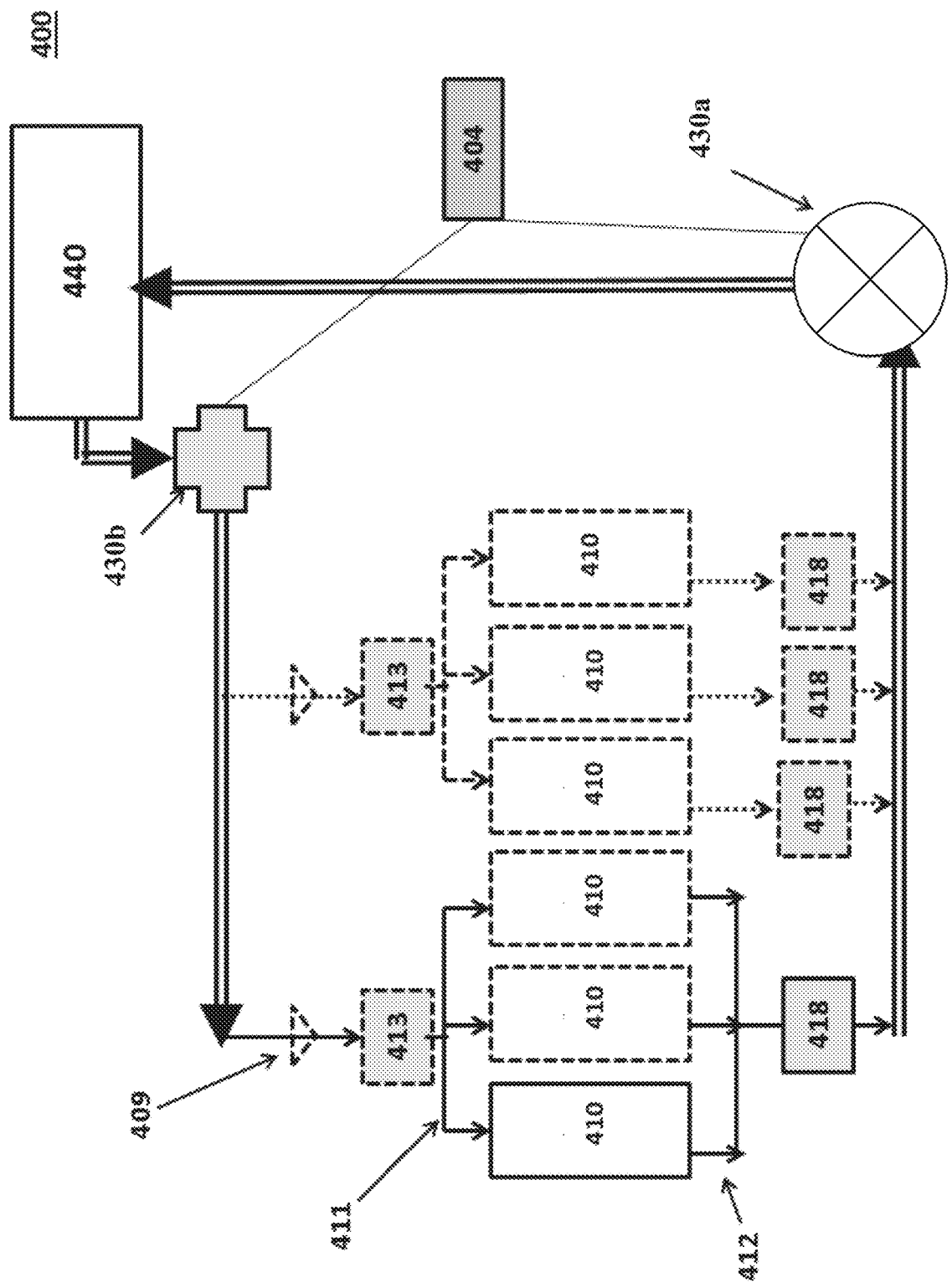

Example cooling systems are shown in FIGS. 4A and 4B. FIG. 4A illustrates an example cooling system 400 with multiple cooling interfaces (e.g., evaporator devices) 410 in fluid communication with coolant inlets 411 and coolant outlets 412. The coolant inlets 411 may include a shut-off valve 413. Alternatively, or in addition to, the coolant outlets may include a shut-off valve 418. A cooling interface 410 may be in fluid communication with an inlet shut-off valve 413 or an outlet shut-off valve 418. FIG. 4B shows an alternative embodiment of a cooling system 400 with a single inlet shut-off valve 413 or a single outlet shut-off valve 418 that is in fluid communication with more than one cooling interface 410. A system may include a mixture of cooling interfaces 410 associated with individual inlet and/or outlet shut-off valves and multiple cooling interfaces associated with a single inlet and/or outlet shut-off valves. The system 403 may further include one or more restrictors 409 disposed upstream of the cooling interface 410, a condenser 440, and one or more flow generators or vacuum pumps 430a, 430b. The condenser 440 and flow generators 430a, 430b may be powered by a power source 404. Liquid coolant may be directed to the cooling interface 410 via pressure driven fluid flow. The cooling interface 410 may be in thermal contact with a source of thermal energy (e.g., an object to be cooled). The coolant may enter the cooling interface 410 through a coolant inlet 411. The coolant inlet may or may not have an inlet shut-off valve 413. The inlet shut-off valve 413 may permit control of the level, volume, or amount of coolant within the cooling interface 410. The liquid coolant may undergo a phase transition to a vapor coolant within the cooling interface 410. The vapor coolant may be directed away from the cooling interface 410 via the coolant outlet 412. The coolant outlet may include an outlet shut-off valve 418. The outlet shut-off valve 418 may permit control of a level, volume, or amount of coolant within the cooling interface 410. The outlet shut-off valve may permit control of the pressure within the cooling interface 410 to thereby control the rate of vaporization of the liquid coolant. The vapor coolant may be directed to the condenser 440 in which the vapor coolant may phase transition to a liquid coolant for return to the cooling interface 410.

The system may comprise one or more inlet shut-off valves. In an example, the system comprises no inlet shut-off valves. In another example, the system comprises multiple inlet shut-off valves. The one or more inlet shut-off valves may be disposed between the first channel and the cooling interface. In an example, the system includes multiple cooling interfaces and each inlet shut-off valve controls the flow of fluid to a single cooing interface. In another example, one inlet shut-off valve controls coolant flow to more than one heat exchange units. The inlet shut-off valve may be integrated with the inlet channel and/or the cooling interface. The inlet shut-off valve may be a metered valve (e.g., controls the flow rate of the fluid) or may be a discrete valve (e.g., valve comprising an open state and a closed state). The inlet shut-off valve may be designed to allow liquid coolant to enter each associated cooling interface which is in fluid communication therewith, while preventing backflow of the liquid coolant as well as of the generated gaseous or vapor coolant.

The system may include one or more outlet shut-off valves. In an example, an individual cooling interface is in fluid communication with an outlet shut-off valve. In another example, multiple cooling interfaces are in fluid communication with an outlet shut-off valve. The outlet shut-off valve may prevent or block the flow of a portion (e.g., may meter the flow) or all of the coolant from the cooling interface to the outlet channel (e.g., second channel). The reduced or blocked flow may maintain the coolant within the cooling interface and may increase the pressure within the cooling interface and, thus, increase the boiling point of the liquid coolant. Increasing the pressure within the cooling interface may reduce or prevent the coolant from undergoing a phase transition from a liquid coolant to a vapor coolant. The pressure within the cooling interface may increase by greater than or equal to about 0.05 atm, 0.1 atm, 0.2 atm, 0.3 atm, 0.4 atm, 0.5 atm, 0.6 atm, 0.7 atm, 0.8 atm, 0.9 atm, 1 atm, 1.2 atm, 1.5 atm, 2 atm, 4 atm, 6 atm, 8 atm, 10 atm, or more. The outlet shut-off valve may maintain the pressure within the cooling interface within a pressure range by blocking or metering (e.g., reducing) the flow of vapor and/or liquid coolant from the cooling interface. The outlet shut-off valve may maintain the pressure of the cooling interface from about 0.1 atm to 0.2 atm, 0.1 atm to 0.4 atm, 0.1 atm to 0.6 atm, 0.1 atm to 0.8 atm, 0.1 atm to 1 atm, 0.1 atm to 1.5 atm, 0.1 atm to 2 atm, 0.1 atm to 3 atm, 0.1 atm to 4 atm, or 0.1 atm to 5 atm.

The outlet and/or inlet shut-off valve may be a mechanical or electrical valve. In a system with outlet and inlet shut-off valves, the outlet and inlet shut-off valves may be the same type of valve or may be different types of valves. The outlet and/or inlet shut-off valve may be controlled by a control unit or may be physically controlled (e.g., by liquid coolant level). In an example, the outlet and/or inlet shut-off valve is a float valve designed to prevent liquid coolant from entering the associated cooling interface when the liquid coolant within the cooling interface unit reaches a pre-defined level/amount. In another example, the system comprises an outlet shut-off valve that is not a float valve and an inlet shut-off valve that is a float valve. For example, when the liquid level is below a threshold volume or level, the inlet shut-off float valve may be in an open position and allow liquid coolant to flow into the cooling interface. When the liquid level reaches the threshold volume or level the float valve may be in a closed interface and prevent liquid coolant from flowing into the cooling interface. Using a float valve may reduce the use of a flow generator to continuously flow the coolant through the cooling system which may reduce maintenance costs and redundant flow generators. Alternatively, or in addition to, the float valve may provide on demand cooling in the absence of a temperature controller or regulator. The float valve may open to provide liquid coolant to the cooling interface when a level of coolant is reduced below a threshold level to replenish the coolant and provide on demand cooling, with or without a temperature controller or regulator. An inlet and an outlet shut-off valve may be the same type of valve or may be a different valve. For example, the inlet valve may be a float valve and the outlet shut-off valve may be a pneumatic, electric, or mechanical valve. The outlet shut-off valve may be a two stage valve with an open and/or close setting or a multi-stage valve that may limit or restrict (e.g., regulate) outlet gas flow from the one or more cooling interfaces. The inlet, outlet, or both the inlet and outlet shut-off valves may be controlled using a solenoid for opening and closing the valve. The outlet and/or inlet shut-off valve may include additional components, such as springs, diaphragms, pneumatic components, or additional fluids to permit the valve to block, partially block, or meter flow of the liquid coolant and/or vapor coolant.

The inlet and/or outlet shut-off float valve may be a mechanical shut-off valve. The specific gravity of the float portion of the valve may be less than the specific gravity of the coolant. Accordingly, when no external forces are applied other than the force of the coolant level rising, the inlet shut-off valve may be lifted and block or close the coolant flow path into the cooling interface. As the coolant evaporates, the liquid level may decrease and the valve may lower and open or unblock the coolant flow path into the cooling interface. Once the liquid coolant level within the cooling interface begins to drop, the valve may automatically open to allow liquid coolant to enter the cooling interface. The flow rate of the liquid coolant into the cooling interface may directly correlate to the amount of gaseous or vapor coolant exiting the cooling interface. The amount of vapor coolant generated may be a direct effect of the heat generated by the heat source to be cooled. Using an inlet shut-off float valve may eliminate the use of sophisticated and complex controlling and adjusting mechanism(s) and monitoring of the cooling process. In an example, the forces induced by the specific gravity differences (e.g., between the valve specific gravity and the coolant specific gravity), is high enough to block, partially block, or meter the flow of liquid coolant to or through the liquid coolant inlet. The inlet shut-off valve may include additional components, such as springs, diaphragms, pneumatic components, or additional fluids to permit the valve to block, partially block, or meter flow of the liquid coolant.

A float shut-off valve may increase the efficiency of the cooling system because liquid coolant enters the cooling interface in which the liquid coolant level has been dropped or reduced and not a cooling interface in which the liquid coolant level is above a threshold. The reduction in the liquid coolant volume or level may be indicative of on-going heat removal from the heat source. Thus, the efficiency of the system may be increased because coolant is being delivered to the cooling interfaces undergoing heat removal and not to the cooling interfaces in which heat is not being removed. Moreover, the rate and speed of liquid coolant entering each cooling interface may be controlled by the rate of evaporation, which may be equivalent to the amount of heat to be removed (e.g., the hotter the heat source, the faster the coolant within a specific cooling interface evaporates, and thus the rate at which the liquid coolant enters the specific cooling interface is faster, and vice-versa). This may permit autonomous or on demand temperature control of the heat source to be cooled. A float valve may be in fluid communication with a single heat exchange unit or a float valve may be in fluid communication with multiple heat exchange units. Additionally, a cooling system comprising an outlet and/or inlet shut-off valve may be advantageous because the liquid coolant does not flow continuously and/or circularly (e.g., does not flow into and out of each cooling interface). The liquid coolant may enter each cooling interface of the system and vapor or gaseous coolant may exit or leave the cooling interface. The inlet shut-off valve may prevent liquid coolant, vapor coolant, or both liquid and vapor coolant from entering the first channel. The outlet shut-off valve may prevent liquid coolant, vapor coolant, or both liquid and vapor coolant from entering the second channel. In an example, the outlet and/or inlet shut-off valve permits the cooling system to be autonomous (e.g., to not use a control system to control the amount and speed of liquid coolant that is pumped through the system and into each cooling interface or the speed of removal of the vapor or gaseous coolant from the cooling interface). The outlet and/or inlet shut-off valve may be any valve that is suitable for permitting one-directional flow, which directs coolant to flow into cooling interface(s) or to the outlet channel, while preventing backflow of the liquid or vapor coolant. The outlet and/or inlet shut-off valve may be a mechanical or electric float valve.

Figure 5A:
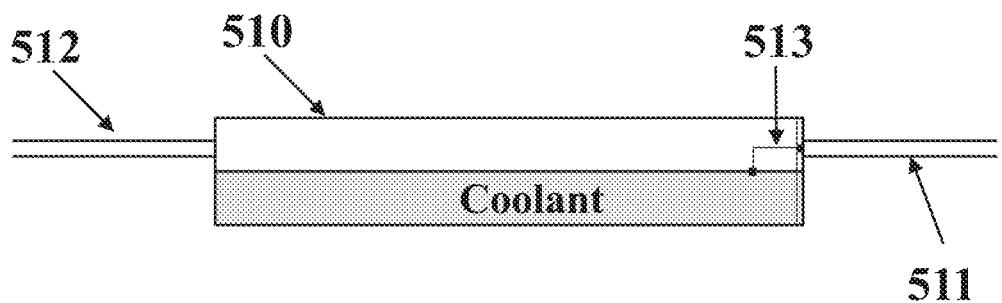
FIGS. 5A and 5B schematically illustrate an example cooling interfaces.
Figure 5B:
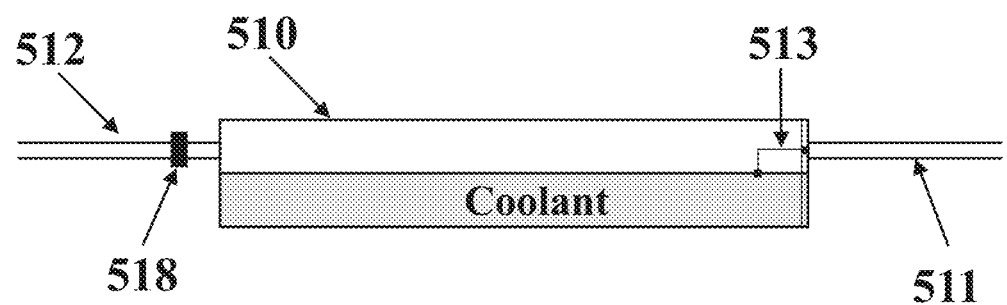

Example shut-off valves are illustrated in FIGS. 5A and 5B. FIG. 5A illustrates an example cooling interface 510 with an inlet shut-off valve. The valve may be a float valve or other type of valve. FIG. 5B illustrates and example of a cooling interface 510 with an outlet shut-off valve 518 and inlet shut-off valve 513. The inlet shut-off valve 513 may be an optional component of the system. The inlet shut-off valve 513 may permit control of the level of the coolant within the cooling interface 510. For example, a system may comprise a liquid coolant inlet 511 that provides liquid coolant to the cooling interface 510. The system may additionally comprise a gas coolant outlet 512 that removes gas coolant from the cooling interface 510. The gas coolant outlet may further comprise an outlet shut-off valve 518. The outlet shut-off valve 518 may permit the regulation of the pressure of the cooling interface and, therefore, may permit maintaining the cooling interface 510 within a window or range of temperatures. The inlet shut-off valve 513 may be disposed adjacent to the liquid coolant inlet 511 of the cooling interface 510. The shut-off float valve may include a float that is disposed at the interface between the liquid coolant and the vapor coolant. The shut-off float valve may indicate the liquid coolant level within the cooling interface. A decrease in the liquid coolant level may cause the position of the float to decreases the valve to open. An increase in the liquid coolant level may cause the position of the float to increase and the valve to close.

The cooling interface may contain a threshold or residual amount of liquid coolant and either the inlet and/or the outlet shut-off valve may prevent liquid coolant from entering or leaving the cooling interface once the threshold level or amount has been reached. The inlet shut-off valve may permit the liquid coolant to enter the cooling interface once the coolant level has dropped below the threshold level.

Alternatively, or in addition two, the outlet shut-off valve may prevent vapor and/or liquid coolant from flowing from the cooling interface once the coolant level has dropped below the threshold level. The level of the coolant in the cooling interface may be reduced due to evaporation of the liquid coolant. Evaporation of the liquid coolant may be due to the transfer of heat from the heat source to the liquid coolant.

The cooling system may cool or maintain a temperature of a heat source by absorbing, or not absorbing, heat from the heat source. Thermal energy may be absorbed by the cooling interface. The cooling interface may include one or more heat exchange units. The cooling interface (e.g., evaporator device) may include at least 1, 2, 3, 4, 6, 8, 10, 15, 20 or more heat exchange units.

The cooling system may further include a flow generator. The flow generator may be a pump, compressor, educator, or any other device designed to direct fluid flow. The cooling system may include at least 1, 2, 3, 4, 5, or more flow generators. The flow generators may be the same type of flow generator or may include multiple types of flow generators (e.g., a pump and a compressor). Alternatively, the system may not include a flow generator. The flow generator may be controlled by a control unit that can activate the flow generator when a temperature threshold is reached or when faster heat removal is required. The cooling system may further comprise additional pump or pumps that may assist in flowing the coolant and/or coolant vapors in the system, as well as a filter or filtration subsystem that allows filtration of the coolant and thus prevent possible clogging of the system. The flow generator and/or pumps may permit the system to operate at a low pressure (e.g., less than 2 atm). Such low pressure system may operate, for example, at a pressure that is less than or equal to about 2 atm, 1.5 atm, 1 atm, 0.5 atm, 0.1 atm, or less (e.g., under vacuum). For example, the flow generator may generate a vacuum that directs flow of the coolant in its liquid form and/or its gaseous form. The flow generator may direct fluid at a volumetric flow rate of greater than or equal to about 0.5 liters per hour (L/h), 1 L/h, 2 L/h, 5 L/h, 10 L/h, 20 L/h, 30 L/h, 40 L/h, 50 L/h, 100 L/h, 200 L/h, 300 L/h, 400 L/h, 500 L/h, 1,000 L/h, 2,000 L/h, 3,000 L/h, 4,000 L/h, 5,000 L/h, 10,000 L/h, 20,000 L/h, 30,000 L/h, 40,000 L/h, or greater. The flow generator may direct fluid at a volumetric flow rate of less than or equal to about 40,000 L/h, 30,000 L/h, 20,000 L/h, 10,000 L/h, 5,000 L/h, 4,000 L/h, 3,000 L/h, 2,000 L/h, 1,000 L/h, 500 L/h, 400 L/h, 300 L/h, 200 L/h, 100 L/h, 50 L/h, 40 L/h, 30 L/h, 20 L/h, 10 L/h, 5 L/h, 2 L/h, 1 L/h, 0.5 L/h, or less.

The flow generator may direct fluid flow from the condenser, through a channel to the cooling interface, and from the cooling interface back to the condenser. The system may include a 2, 3, 4, 5, 6, 8, 10, or more channels. In an example, the system includes a first channel and a second channel. The first channel may direct the flow of liquid coolant and the second channel may direct the flow of vapor coolant. The channels may be flexible or ridged. The channels may be formed of thermally insulating materials (e.g., plastics). The first and second channel may be formed of the same materials or may be formed of different materials. The channels may have a cross-sectional area that is constant or that varies. The first and the second channel may have the same cross-sectional area or may have different cross-sectional areas. For example, the cross-sectional area of the first channel (e.g., the channel directing the liquid coolant) may be smaller than the cross-sectional area of the second channel (e.g., the channel directing the vapor coolant).

The cooling system may have a single cooling interface or multiple cooling interfaces. The cooling system may have at least 1, 2, 3, 4, 6, 8, 10, 20, 40, 60, 80, 100, or more cooling interfaces. The cooling system may include cooling interfaces connected in a parallel or series configuration. The cooling system may include at least one line or set of 2, 3, 4, 5, 6, 7, 8, 9, 10 or more cooling interface connected in a series configuration. Alternatively, or in addition to, the cooling system may have at least one line or set of 2, 3, 4, 5, 7, 8, 9, 10 or more cooling interface connected in parallel. In an example, the cooling system comprises at least one line or set of 2, 3, 4, 5, 6, 7, 8, 9, 10 or more cooling interface connected both in series and in parallel. The cooling interfaces of the system may be grouped such that a single outlet shut-off valve controls the flow of coolant from the group of cooling interfaces. The cooling system may have multiple groups of cooling interfaces, each in fluid communication with a single outlet shut-off valve. A group of cooling interfaces may include at least 2, 3, 4, 5, 6, 7, 8, 9, 10, or more cooling interfaces. A cooling system may include at least 2, 3, 4, 5, 6, 7, 8, 9, 10, 20, 30, 40, 50, or more groups of cooling interfaces.

The cooling system may include one or more coolants or cooling agents. The coolant may be a refrigerant, a dielectric fluid, or any fluid with a high latent heat of evaporation. The liquid coolant may be non-corrosive and may be compatible with electronic components. The liquid coolant may also be non-toxic and non-flammable. The coolant may comprise aromatic, silicate-ester, aliphatic, silicone, or fluorocarbon compounds. The coolant may include alcohol, water, glycol, a salt solution, or any combination thereof. Non-limiting examples of heat transfer fluids (e.g., coolants) may include halon replacement fluids (e.g., Novec fluids), R245fa, R123, R514a, other low pressure coolants, or any combination thereof.

The cooling system may be provided empty (e.g., without any coolant) and coolant may be added to the system after installation of the cooling system. The coolant or cooling agent may vaporize at less than or equal to about 1 atm at a temperature of less than or equal to 50° C. The coolant may vaporize at a pressure of less than or equal to about 1 atm and a temperature from about 0° C. to 40° C., 0° C. to 30° C., 0° C. to 20° C., 0° C. to 10° C., 5° C. to 25° C., 10° C. to 25° C., 15° C. to 25° C., or from 5° C. to 20° C. The coolant or cooling agent may vaporize at 25° C. at a pressure of from about 0 atm to about 1 atm, from about zero atm to about 0.8 atm, from about zero atm to about 0.5 atm, from about zero atm to about 0.3 atm, or from about zero atm to about 0.1 atm.

The cooling system may further comprise a power source, such as power supply or a battery. The system may be connected directly to the main power grid and may not be portable. Alternatively, or in addition to, the power source may be a battery and the system may be portable. In an example, the system is connected to a power supply (e.g., grid or building power supply) and further comprises a battery in the event of power failure.

The cooling system may include one or more a controllers for controlling the operation of the system. The controller may control flow of the coolant, rate of condensation of the coolant, temperature thresholds for providing coolant, or any combination thereof. The control unit for controlling the amount and speed of liquid coolant pumped through the system and/or into each cooling interface. The control unit may control the removal speed of coolant vapors from the cooling interface and/or the flow of ambient air through cooling fins of the condenser (e.g., fan speed). In an example, the liquid coolant flow rate and/or the gaseous coolant flow rate is controlled by at least one pressure regulator associated with flow generator. The control unit may be in communication with the inlet shut-off valve, outlet shut-off valve, or both the inlet and outlet shut-off valve. The control unit may signal or direct the inlet shut-off valve to open when the temperature of the cooling interface or object to be cooled rises above an upper temperature limit or threshold. The control unit may signal or direct the outlet shut-off valve to close when the temperature of the cooling interface or object to be cooled falls below a lower temperature limit or threshold.

The cooling system may comprise one or more orifices or expansion chambers. The orifice or expansion chamber may be in fluid communication with the channels (e.g., the first or second channel). The orifices or expansion chambers may be in fluid communication with the cooling interface. The orifices or expansion chambers may decrease the pressure within the cooling interface. The orifice may be a Venturi. The expansion chamber or container may accumulate liquid coolant prior to providing the liquid coolant to the cooling interface. The cooling system may include one or more splitters that split the fluid flow paths (e.g., coolant and vacuum between parallel cooling interfaces. The cooling system may include coolant pipes in which the coolant flows. The coolant pipes may be flexible and made of any suitable material, such as plastic, rubber, silicone, polyurethane, or metal.

The cooling system may include power wires or communication wires. The power wires may provide power to the cooling system or heat source. The communication wires may be in communication with the controller and may permit the controller to control the cooling system. The cooling system may include a user interface for displaying the temperature at the cooling interface and/or the surroundings. The user interface may be any screen, such as a computer screen, a tablet or a smart phone, or a screen attached to or associated with the cooling system or the heat source. The cooling system may include one or more thermocouples or temperature sensors. The thermocouples may be in communication with the controller and may permit automatic activation of the cooling system when the temperature reaches an upper or a lower temperature threshold. The upper temperature threshold may be greater than or equal to about 10° C., 15° C., 20° C., 25° C., 30° C., 35° C., 40° C., 45° C., 50° C., 60° C., 70° C., 80° C., 90° C., 100° C., 110° C., 120° C., or greater. The lower temperature threshold may be less than or equal to about 120° C., 110° C., 100° C., 90° C., 80° C., 70° C., 60° C., 50° C., 45° C., 40° C., 35° C., 30° C., 25° C., 20° C., 15° C., 10° C., or less. The thermocouples may be in communication with the controller and may permit automatic activation of the cooling system when the temperature is outside of a temperature range or temperature window. The temperature range or window may be from about 5° C. to 10° C., 5° C. to 20° C., 5° C. to 30° C., 5° C. to 40° C., 5° C. to 50° C., 5° C. to 60° C., 5° C. to 70° C., 5° C. to 90° C., 5° C. to 90° C., 5° C. to 100° C., 5° C. to 110° C., 5° C. to 120° C., 10° C. to 20° C., 10° C. to 30° C., 10° C. to 40° C., 10° C. to 50° C., 10° C. to 60° C., 10° C. to 70° C., 10° C. to 80° C., 10° C. to 90° C., 10° C. to 100° C., 10° C. to 120° C., 20° C. to 30° C., 20° C. to 40° C., 20° C. to 50° C., 20° C. to 60° C., 20° C. to 70° C., 20° C. to 80° C., 20° C. to 90° C., 20° C. to 100° C., 20° C. to 120° C., 30° C. to 40° C., 30° C. to 50° C., 30° C. to 60° C., 30° C. to 70° C., 30° C. to 80° C., 30° C. to 90° C., 30° C. to 100° C., 30° C. to 110° C., 30° C. to 120° C., 40° C. to 50° C., 40° C. to 60° C., 40° C. to 70° C., 40° C. to 80° C. 40° C. to 90° C., 40° C. to 100° C., 40° C. to 110° C. 40° C. to 120° C. 50° C. to 60° C., 50° C. to 70° C., 50° C. to 80° C., 50° C. to 90° C., 50° C. to 100° C., 50° C. to 110° C., 50° C. to 120° C., 60° C. a to 70° C., 60° C. to 80° C., 60° C. to 90° C., 60° C. to 100° C., 60° C. to 110° C., 60° C. to 120° C. 70° C. to 80° C., 70° C. to 90° C., 70° C. to 100° C., 70° C. to 110° C., 70° C. to 120° C., 80° C. to 90° C., 80° C. to 100° C., 80° C. to 110° C., 80° C. to 120° C., 90° C. to 100° C., 90° C. to 110° C., 90° C. to 120° C., 100° C. to 110° C., 100° C. to 120° C., or 110° C. to 120° C.

The cooling system may include a transmitter for transmitting date (e.g., temperature or coolant flow rate) to a remote computer or smart phone, either constantly or periodically. The cooling system may include a computer processor and memory. The computer processor and memory may control the cooling system and store data from the cooling system and heat source.

The cooling system may comprise at least one sensor. The sensor may permit the cooling system to sense that the temperature of either the heat source or the surroundings has exceeded predetermined temperature (e.g., a temperature at which the heat source may be damaged or become inoperable). The sensor may send an alert, turn the cooling system on, or increase the activity of the cooling system by increasing work load, activate additional parallel cooling interfaces, and/or execute an emergency shutdown of the heat source or the entire electronic system comprising the heat source.

The cooling system may comprise a thermostat. The thermostat may permit the cooling system to activate and cool the heat source when the threshold temperature of the heat source or temperature of the surroundings has been reached. Operating the cooling system when the threshold temperature has been reached and not when the threshold temperature has not been reached may increase efficiency of the system and reduce resource use (e.g., power).

The system may be controlled by a control unit or may be self-regulating. Such self-regulation may be employed using an outlet and/or inlet shut-off valve, such as a float valve or pressure relief valve. Such self-regulation may be employed in the absence of a sensor that detects fluid level or fluid volume. The system may further comprise a pressure regulator that regulates the pressure of the cooling interface, condenser, channels, or any combination thereof. The pressure regulator may be in fluid communication with at least one of the first channel, the second channel, the cooling interface, the condenser, the flow generator, or any combination thereof. In an example, the system comprises multiple pressure regulators and each pressure regulator may be in fluid communication with multiple components of the system. The pressure regulate may control the flow rate of the liquid coolant or the vapor coolant.

The cooling system may be used to cool any type of heat source. For example, the cooling system may be used to cool a server room or farm, central processing unit (CPU), graphics processing unit (GPU), or any other electronic component which generates heat (e.g., a computer or any other electronic device). The cooling system may be used to cool batteries (e.g., high capacity batteries for electric vehicles). The cooling system may be used to cool components during three-dimensional printing and other fabrication processes.

In an example, the porous unit may be used in a cooling system is used to cool energy storage devices (e.g., batteries). The cooling system may include a liquid coolant reservoir configured to contain a liquid coolant, a cooling unit in fluid communication with the liquid coolant reservoir and thermal communication with the energy storage device, a fluid flow line in fluid communication with the cooling unit, and a condenser in fluid communication with the fluid flow line and the liquid coolant reservoir. The energy storage device may comprise one or more cells. The one or more cells may be disposed internal to the cooling unit such that the one or more cells are at least partially submerged within the liquid coolant. The cooling unit may be configured to permit transfer of thermal energy from the one or more cells of the energy storage device to the liquid coolant in the cooling unit. The transfer of thermal energy from the energy storage device to the liquid coolant may permit the liquid coolant to undergo a phase transition to a vapor coolant. The fluid flow line may be configured to accept the vapor coolant from the cooling unit. The condenser may be configured to permit the vapor coolant to expel thermal energy and undergo phase transition to the liquid coolant to regenerate the liquid coolant. The cooling system to cool energy storage devices may include one or more porous units. The porous units may be disposed adjacent to one or more surfaces of the one or more cells.

In another example, the porous unit is used in a system to cool energy storage devices. The system may comprise a liquid coolant reservoir configured to contain a liquid coolant, a plurality of microchannel evaporators in fluid communication with the liquid coolant reservoir and thermal communication with the energy storage device, a fluid flow line in fluid communication with the plurality of microchannel evaporators, and a condenser in fluid communication with the fluid flow line and the liquid coolant reservoir. The energy storage device may comprise one or more cells. The plurality of microchannel evaporators may be configured to permit transfer of thermal energy from the one or more cells of the energy storage device to the liquid coolant in the plurality of microchannel evaporators. The transfer of thermal energy from the energy storage device to the liquid coolant may permit the liquid coolant to undergo a phase transition to a vapor coolant. The fluid flow line may be configured to accept the vapor coolant from the plurality of microchannel evaporators. The condenser may be configured to permit the vapor coolant to expel thermal energy and undergo phase transition to the liquid coolant to regenerate the liquid coolant. The system may further comprise a porous unit or a plurality of porous units. The porous unit may be disposed within the microchannel evaporators (e.g., adjacent to the walls of the microchannel evaporators).

In another example, the porous unit is used in a system to cool energy storage devices. The system may comprise an evaporator configured to contain a liquid coolant and a vapor coolant, a fluid flow line in fluid communication with the evaporator, and a condenser in fluid communication with the fluid flow line and the evaporator. The energy storage device may comprise one or more cells. The evaporator may comprise a surface that is in thermal communication with the one or more cells. The evaporator may be configured to permit transfer of thermal energy from the one or more cells of the energy storage device to the liquid coolant such that at least a portion of the liquid coolant in the evaporator undergoes a phases transition to yield a vapor coolant in a space adjacent to the liquid coolant and disposed away from the surface. The fluid flow line may be configured to accept the vapor coolant from the evaporator. The condenser may be configured to permit the vapor coolant to expel thermal energy and undergo phase transition to the liquid coolant to regenerate the liquid coolant. The evaporator may further comprise a porous unit. The porous unit may be disposed adjacent to the surface of the evaporator.

Methods for Cooling a Heat Source

In another aspect, the present disclosure provides methods for cooling a heat source. The method may include providing an evaporator device in thermal communication with a heat source. The evaporator device may include a chamber and/or a porous unit. The chamber may include an inlet, an outlet, and/or a surface. The porous unit may be adjacent to the surface. The inlet may provide or direct a liquid coolant to the chamber. The outlet may direct a vapor coolant away from the chamber. The surface may be in thermal communication with a liquid coolant or a vapor coolant. The surface and the porous unit may comprise or be different materials. The porous unit may be thermally insulating. The porous unit may absorb the liquid coolant or be used to absorb liquid coolant. The porous unit may bring the liquid coolant into thermal communication with the surface to permit heat to flow from the heat source to the liquid coolant. The heat may subject the liquid coolant to a phase transition to a vapor coolant. The porous unit may direct the vapor coolant away from the surface to cool the heat source.

In another aspect, the present disclosure provides methods for cooling a heat source. The method may include providing a cooling system comprising at least one cooling interface in fluid communication with a first channel, a second channel, and a condenser. The cooling interface may include a coolant inlet, a heat exchange unit, at least one porous unit, and a coolant outlet. A liquid coolant may be directed from the first channel to the cooling interface(s). The cooling interface(s) may use the porous unit to absorb liquid coolant and bring the liquid coolant into thermal communication with the heat exchange unit to permit heat to flow from a heat source to the liquid coolant. The heat may subject the liquid coolant to a phase transition to a vapor coolant. The vapor coolant may be directed from the cooling interface(s) through the second channel to the condenser. The vapor coolant may be subjected to a second phase transition to form the liquid coolant (e.g., to condense the vapor coolant to a liquid coolant).

In another aspect, the present disclosure provides methods for cooling a heat source. The method may include providing a cooling system comprising at least one cooling interface in fluid communication with a first channel, a second channel, and a condenser. The cooling interface may include a coolant inlet, a heat exchange unit, a plurality of fins, and a coolant outlet. The plurality of fins may extend into the cooling interface(s) such that the plurality of fins come in contact with a liquid or vapor coolant. The plurality of fins may be in thermal communication with the heat exchange unit. A liquid coolant may be directed from the first channel to the cooling interface(s). The cooling interface(s) may use the plurality of fins and heat exchange unit to permit heat to flow from a heat source to the liquid coolant. The heat may subject the liquid coolant to a phase transition to a vapor coolant. The vapor coolant may be directed from the cooling interface(s) through the second channel to the condenser. The vapor coolant may be subjected to a second phase transition to form the liquid coolant (e.g., to condense the vapor coolant to a liquid coolant).

The porous unit may preferentially increase the formation of nucleation sites on the surface and, therefore, reduce the transition or film boiling (e.g., to increase the cooling efficiency). The vapor formed by nucleate boiling may be directed away from the surface (e.g., of a heat emitting object, heat exchange unit, heat spreader, etc.). Directing the vapor away from the surface may increase the efficiency of the evaporator device as the thermal conductivity of vapor coolant may be less than the thermal conductivity of the liquid coolant (e.g., heat flux from the surface to the coolant may increase). The porous unit may partially or completely isolate the surface from the vapor coolant. The porous unit may include a porous material such as, but not limited to, cellulose, metal sponge, metal mesh, polymers, ceramic, pumice, or natural fibers. The porous unit may comprise be a heat tolerant material (e.g., capable of withstanding temperature of at least 200° C.). The porous unit may comprise a material that is substantially different from the surface. The porous unit may comprise a thermally conductive material (e.g., metal mesh or sponge). Alternatively, or in addition to, the porous unit may comprise a material with low thermal conductivity (e.g., cellulose or natural fibers). A porous unit may be a continuous material or may be segments of materials disposed adjacent to one another. A porous unit may comprise a single material or may be a composite material. For example, a porous unit may comprise one type of material adjacent to a heat transfer surface (e.g., heat emitting object, heat exchange unit, or fin) and another type of material away from the heat transfer surface or internal to the porous material.

The porous unit may be thermally insulating. Alternatively, or in addition to, the porous unit may be thermally conductive. A thermally insulating porous unit may reduce the flux of heat away from the surface to below the critical heat flux (e.g., heat flux at which a phase change occurs during heating). Reducing the heat flux may permit nucleate boiling in which isolated bubbles form at nucleation sites and separate from the surface. Nucleate boiling may induce fluid mixing near the surface and increase convective heat transfer and heat flux. The thermally insulating porous unit may increase or maintain nucleate boiling which may increase the cooling efficiency of the evaporator device by providing evaporation at the surface of the evaporator device. The nucleate boiling temperature may be the surface temperature. The nucleate boiling temperature may be greater than the saturation temperature (e.g., bulk boiling temperature). The efficiency of the evaporator device may increase as the nucleate boiling temperature becomes closer to the saturation temperature. For example, an evaporator device with a nucleate boiling temperature that is 10° C. greater than the saturation temperature may be less efficient than an evaporator device with a nucleate boiling temperature that is 5° C. greater than the saturation temperature. The surface and porous unit may be configured such that the nucleate boiling temperature is within 10° C., 9° C., 8° C., 7° C., 6° C., 5° C., 4° C., 3° C., 2° C., 1° C., or less degrees of the saturation temperature. The difference between the nucleate boiling temperature and the saturation temperature may be less than or equal to about 10° C., 9° C., 8° C., 7° C., 6° C., 5° C., 4° C., 3° C., 2° C., 1° C., or less. In an example, the difference between the nucleate boiling temperature and the saturation temperature may be less than or equal to about 7° C. In an example, the difference between the nucleate boiling temperature and the saturation temperature may be less than or equal to about 5° C. In an example, the difference between the nucleate boiling temperature and the saturation temperature may be less than or equal to about 3° C. In an example, the difference between the nucleate boiling temperature and the saturation temperature may be less than or equal to about 2° C. In an example, the difference between the nucleate boiling temperature and the saturation temperature may be less than or equal to about 1° C. In an example, the difference is less than 1° C. The difference between the nucleate boiling temperature and the saturation temperature may be from about 1° C. to 2° C., 1° C. to 3° C., 1° C. to 4° C., 1° C. to 5° C., 1° C. to 6° C., 1° C. to 7° C., 1° C. to 8° C., 1° C. to 9° C., or 1° C. to 10° C. The difference between the nucleate boiling temperature and the saturation temperature may vary with the pressure of the evaporator device. For example, a high pressure (e.g., above 2 atmospheres) may reduce the difference. A low pressure (e.g., less than 2 atmospheres) may increase the difference. In an example, the evaporator device may have a pressure of less than 1 atmosphere and the difference between the nucleate boiling temperature and the saturation temperature may be less than 3° C. or less than 1° C.

The porous unit may have a structure or material properties that permits or accelerates the formation of coolant nucleation (e.g., increases the formation of vapor coolant bubbles). The porous unit may permit the free flow or substantially free flow of vapor coolant. The structure of the porous unit may be as described elsewhere herein. For example, the porous unit may have pores that are monodisperse or polydisperse. The pores of the porous unit may be interconnected such that they form a tortuous fluid flow path from one surface to another. The porous unit may wick the liquid coolant (e.g., via capillary action) along a length of the porous unit. In an example, the porous unit directs coolant along a surface of a heat exchange unit or heat emitting object. In another example, the porous unit directs coolant along a length of a fin.

The porous unit may be thermally insulating or thermally conductive. The thermal conductivity of the porous unit may be less than or equal to about 50 W/m-K, 40 W/m-K, 30 W/m-K, 20 W/m-K, 10 W/m-K, 5 W/m-K, 4 W/m-K, 3 W/m-K, 1 W/m-K, 0.5 W/m-K, 0.25 W/m-K, 0.1 W/m-K, or less. In an example, the thermal conductivity of the porous unit is less than or equal to 10 W/m-K. In an example, the thermal conductivity of the porous unit is less than or equal to 5 W/m-K. In an example, the thermal conductivity of the porous unit is less than or equal to 1 W/m-K. The thermal conductivity of the porous unit may be from about 0.1 W/m-K to 0.25 W/m-K, 0.1 W/m-K to 0.5 W/m-K, 0.1 W/m-K to 1 W/m-K, 0.1 W/m-K to 2 W/m-K, 0.1 W/m-K to 3 W/m-K, 0.1 W/m-K to 4 W/m-K, 0.1 W/m-K to 5 W/m-K, 0.1 W/m-K to 10 W/m-K, 0.1 W/m-K to 20 W/m-K, 0.1 W/m-K to 30 W/m-K, 0.1 W/m-K to 40 W/m-K, or 0.1 W/m-K to 50 W/m-K. The thermally conductivity of the porous unit may be less than the thermal conductivity of the surface. The thermal conductivity of the surface may be greater than or equal to about 10 W/m-K, 20 W/m-K, 30 W/m-K, 40 W/m-K, 50 W/m-K, 60 W/m-K, 80 W/m-K, 100 W/m-K, 120 W/m-K, 150 W/m-K, 200 W/m-K, 250 W/m-K, 300 W/m-K, 400 W/m-K, 500 W/m-K, or more. In an example, the thermal conductivity of the surface is greater than or equal to 10 W/m-K.

The porous unit may be a single layer or multiple layers. The porous unit may have greater than or equal to 1, 2, 3, 4, 6, 8, 10, 12, 15, 20, 25, 30, 40, 50, 75, 100, or more layers. A layer of the porous unit may have pores of the same average cross-sectional dimension (e.g., diameter) as the pores of the other layers of the multilayer porous unit. Alternatively, or in addition to, the multilayer porous unit may have layers with differing average cross-sectional dimensions (e.g., diameters). In an example, a multilayer porous unit may have layers both with pores of the same average cross-sectional dimension (e.g., diameter) and different average cross-sectional dimensions (e.g., diameters). In an example, the average cross-sectional dimensions may vary from about 50 μm to 1500 μm.

The porous unit may be disposed in direct, full or partial, contact with the heat emitting object (e.g., source of thermal energy). Alternatively, or in addition to, the porous unit may be disposed in direct, full, or partial contact with a thermal extension in thermal communication with the heat emitting object. A thermal extension may be the heat exchange unit or a thermally conductive material (e.g., heat sink or heat spreader) disposed between the source of thermal energy and the heat exchange unit. In an example, the surface comprises one or more (e.g., a plurality of) fins and the porous unit is disposed adjacent to the fins. In another example, the surface may not include fins and the porous unit is disposed adjacent to the heat exchanger (e.g., heat spreader). In another example, the heat emitting object may be submerged in the coolant and the porous unit may be disposed adjacent to the heat emitting object (e.g., in direct contact with the heat source).

The surface of the evaporator device may be a heat emitting object (e.g., heat source or source of thermal energy). Alternatively, or in addition to, the surface of the evaporator device may be heat spreader, heat exchange unit, or other thermally conductive material. In an example, the surface is a heat emitting object and the porous unit directly contacts the heat emitting object. The heat emitting object may be a battery. The porous unit may be used with the battery cooling systems. In another example, the evaporator device is a heat exchange unit or heat spreader and the porous unit directly contacts the heat exchange unit or heat spreader. The heat exchange unit may include fins as described elsewhere herein. The porous unit may be disposed over the fins or may surround the fins. In an example, the evaporator device includes a plurality of fins and porous units and the plurality of porous units are disposed between the fins.

A heat exchange unit may include one or more heat sinks, heat spreaders, or fins that transfer heat from the heat source to the liquid coolant. The heat exchange units may comprise a material with high thermal conductivity, such as, for example, metals (e.g., copper, aluminum, iron, steel, etc.), non-metal conductors (e.g., graphite or silicon), heat transfer fluids, or any combination thereof. The heat exchange unit may be disposed adjacent to a source of thermal energy (e.g., heat source). The heat exchange unit may be an integrated part of the cooling interface or may be separable. The heat exchange unit may be in direct contact with an object to be cooled (e.g., a source of thermal energy). Alternatively, or in addition to, the heat exchange unit may be in indirect contact with the object to be cooled (e.g., may be in contact with a heat conducting material or fluid that is in contact with the object). In an example, the heat exchange unit is in contact with a heat sink that is in contact with the source of thermal energy.

The evaporator device (e.g., cooling interface) may be incorporated into a cooling system. The cooling system may further include a flow generator and the method may include activating the flow generator. The flow generator may be a pump, compressor, educator, or any other device designed to direct fluid flow. The cooling system may include at least 1, 2, 3, 4, 5, or more flow generators. The flow generators may be the same type of flow generator. Alternatively, the system may not include a flow generator. The flow generator may be controlled by a control unit that can activate the flow generator when a temperature threshold is reached or when faster heat removal is required. The flow generator may be activated when a threshold temperature of the heat source or environment surrounding the heat source is reached. The flow generator may permit the system of operate a low pressure (e.g., less than 2 atm). For example, the flow generator may generate a vacuum that directs the flow of the coolant in its liquid form and/or its gaseous form. The flow generator may direct fluid at a volumetric flow rate of greater than or equal to about 0.5 liters per hour (L/h), 1 L/h, 2 L/h, 5 L/h, 10 L/h, 20 L/h, 30 L/h, 40 L/h, 50 L/h, 100 L/h, 200 L/h, 300 L/h, 400 L/h, 500 L/h, 1,000 L/h, 2,000 L/h, 3,000 L/h, 4,000 L/h, 5,000 L/h, 10,000 L/h, 20,000 L/h, 30,000 L/h, 40,000 L/h, or greater. The flow generator may direct fluid at a volumetric flow rate of less than or equal to about 40,000 L/h, 30,000 L/h, 20,000 L/h, 10,000 L/h, 5,000 L/h, 4,000 L/h, 3,000 L/h, 2,000 L/h, 1,000 L/h, 500 L/h, 400 L/h, 300 L/h, 200 L/h, 100 L/h, 50 L/h, 40 L/h, 30 L/h, 20 L/h, 10 L/h, 5 L/h, 2 L/h, 1 L/h, 0.5 L/h or less. The method may comprise activating a flow generator to flow the coolant within the system.

The activation of the cooling system may be automatic (e.g., self-regulating) when a threshold temperature is reached or may be controlled by a controller. The temperature of the cooling system and heat source may be monitored or the temperatures may not be monitored. The coolant flow rate of the system may increase or decrease as the temperature of the heat sources increases and decreases, respectively. The coolant flow rate may be self-regulated or controlled by the flow generator.

The method may include monitoring the temperature of the heat source, the environment surrounding the heat source, or the cooling interface. The temperature may be monitored by one or more thermocouples. The thermocouples may be in communication with the controller and may permit automatic activation of the cooling system when the temperature reaches an upper temperature threshold. The upper temperature threshold may be greater than or equal to about 10° C., 15° C., 20° C., 25° C., 30° C., 35° C., 40° C., 45° C., 50° C., 60° C., 70° C., 80° C., 90° C., 100° C., 110° C., 120° C., or greater. The thermocouple may signal the controller to stop directing coolant away from the cooling interface when the temperature is below a lower limit of the temperature window or range. The lower limit of the temperature window or range may be less than or equal to 120° C., 110° C., 100° C., 90° C., 80° C., 70° C., 60° C., 50° C., 45° C., 40° C., 35° C., 30° C., 25° C., 20° C., 15° C., 10° C., or less. The thermocouples may be in communication with the controller and may permit automatic activation of the cooling system when the temperature is outside of a temperature range or temperature window. The temperature range or window may be from about 5° C. to 10° C., 5° C. to 20° C., 5° C. to 30° C., 5° C. to 40° C., 5° C. to 50° C., 5° C. to 60° C., 5° C. to 70° C., 5° C. to 90° C., 5° C. to 90° C., 5° C. to 100° C., 5° C. to 110° C., 5° C. to 120° C., 10° C. to 20° C., 10° C. to 30° C., 10° C. to 40° C., 10° C. to 50° C., 10° C. to 60° C., 10° C. to 70° C., 10° C. to 80° C., 10° C. to 90° C., 10° C. to 100° C., 10° C. to 120° C., 20° C. to 30° C., 20° C. to 40° C., 20° C. to 50° C., 20° C. to 60° C., 20° C. to 70° C., 20° C. to 80° C., 20° C. to 90° C., 20° C. to 100° C., 20° C. to 120° C., 30° C. to 40° C., 30° C. to 50° C., 30° C. to 60° C., 30° C. to 70° C., 30° C. to 80° C., 30° C. to 90° C., 30° C. to 100° C., 30° C. to 110° C., 30° C. to 120° C., 40° C. to 50° C., 40° C. to 60° C., 40° C. to 70° C., 40° C. to 80° C., 40° C. to 90° C., 40° C. to 100° C., 40° C. to 110° C., 40° C. to 120° C., 50° C. to 60° C., 50° C. to 70° C., 50° C. to 80° C., 50° C. to 90° C., 50° C. to 100° C., 50° C. to 110° C., 50° C. to 120° C., 60° C. to 70° C., 60° C. to 80° C., 60° C. to 90° C., 60° C. to 100° C., 60° C. to 110° C., 60° C. to 120° C., 70° C. to 80° C., 70° C. to 90° C., 70° C. to 100° C., 70° C. to 110° C., 70° C. to 120° C., 80° C. to 90° C., 80° C. to 100° C., 80° C. to 110° C., 80° C. to 120° C., 90° C. to 100° C., 90° C. to 110° C., 90° C. to 120° C., 100° C. to 110° C., 100° C. to 120°

C., or 110° C. to 120° C. In an example, the temperature window may be from 5° C. to 50° C.

The method may change or maintain the temperature of heat source and/or the surroundings to a temperature of about 25° C. The temperature of the heat source of the surrounding environment may be maintained in a range from about −20° C. to about 25° C., from about −15° C. to about 20° C., from about −10° C. to about 20° C., from about −5° C. to about 20° C., from about 0° C. to about 20° C., from about 0° C. to about 15° C., from about −5° C. to about 15° C., from about −5° C. to about 10° C., or from about −5° C. to about 5° C. In an example, the method may maintain the temperature of a heat source, such as electronic components (e.g., a server room, a CPU and/or a CPU), at a temperature of from about 40° C. to about 50° C.

The cooling system may cool or maintain a temperature of a heat source by absorbing, or not absorbing, heat from the heat source. Thermal energy may be absorbed by the cooling interface. The cooling interface may include one or more heat exchange units. The cooling interface may include at least 1, 2, 3, 4, 6, 8, 10, 15, 20 or more heat exchange units. A heat exchange unit may include one or more heat sinks, heat spreaders, or fins that transfer heat from the heat source to the liquid coolant. The heat exchange units may comprise a material with high thermal conductivity, such as, for example, metals (e.g., copper, aluminum, iron, steel, etc.), non-metal conductors (e.g., graphite or silicon), heat transfer fluids, or any combination thereof. The heat exchange unit may be disposed adjacent to a source of thermal energy (e.g., heat source). The heat exchange unit may be an integrated part of the cooling interface or may be separable. The heat exchange unit may be in direct contact with an object to be cooled (e.g., a source of thermal energy). Alternatively, or in addition to, the heat exchange unit may be in indirect contact with the object to be cooled (e.g., may be in contact with a heat conducting material or fluid that is in contact with the object). In an example, the heat exchange unit is in contact with a heat sink that is in contact with the source of thermal energy.

The heat exchange unit may comprise one or more chambers, channels, or fins. At least one surface of the heat exchange unit may have fins, grooves, and/or columns. The heat exchange unit may generate a thin layer of liquid coolant in thermal communication with the heat source. The chamber may be sealed such that coolant may enter and exit the chamber through the coolant inlet and coolant outlet, respectively. The thin layer of coolant may increase the efficiency of cooling. In an example, the heat exchange unit comprises a chamber. The chamber may be a thin chamber such that the liquid coolant forms a thin layer of coolant. The coolant may flow parallel to a long dimension of the chamber. The coolant may be in a liquid phase on one side of the chamber (e.g., near the cooling interface inlet) and a vapor phase on another side of the chamber (e.g., near the cooling interface outlet). In another example, the chamber may not be a thin chamber. The chamber may be configured to allow the liquid coolant to pool in the chamber. The pool of liquid coolant may be disposed on a side of the heat exchange unit disposed adjacent to the source of thermal energy. Alternatively, or in addition to, the source of thermal energy may be disposed in the pool of liquid coolant. The chamber may have a coolant inlet that directs or provides liquid coolant to the chamber. The chamber may have a coolant outlet that directs liquid and/or vapor coolant out of the chamber. The coolant outlet may be disposed below the level of the liquid coolant, at the level of the liquid coolant, or above the level of the liquid coolant. In an example, the coolant outlet is disposed above the level of the liquid coolant such that only vapor coolant passes through the coolant outlet. The chamber may have any configuration or dimension described elsewhere herein.

The cooling interface (e.g., evaporator device) may further comprise one or more fins. The tins may extend into the cooling interface such that the fins contact the coolant. The fins may contact the liquid coolant, vapor coolant, or both the liquid and vapor coolant. The fins may be an integral part of the heat exchange unit (e.g., are connected to the heat exchange unit and/or the heat exchange unit and fins are formed of a single material). Alternatively, or in addition to, the fins may separable from or formed of a separate material from the heat exchange unit. In an example, the fins extend from a surface of the heat exchange unit into the chamber of the heat exchange unit to contact the coolant. A cooling interface may include at least 1, 2, 4, 6, 8, 10, 12, 15, 20, 35, 30, 40, 50, 60, 80, 100, or more fins. The fins may be disposed such that a long dimension of the fin (e.g., height of the fin) if substantially perpendicular or perpendicular to a surface of the heat exchange unit in thermal contact with the object to be cooled. The fins may comprise any shape. For example, the fins may be vertically mounted plates, columns, rods, cones, pyramids, or any other shape useful for heat transfer. The fins may be the same shape or the fins within a cooling unit may be multiple shapes. The fins may have smooth surfaces or may include protrusions to increase the surface area of the fin. The fins may have any configuration or dimension described elsewhere herein.

The fins may be disposed such that fluid from the coolant inlet can flow around and surround the fins. At least a portion of the fins may be in contact with the liquid coolant. For example, a lower portion of the fin (e.g., a portion closes to the object to be cooled) may be in contact with the liquid coolant. At least a portion of the fins may be in contact with the vapor coolant. For example, an upper portion of the fin (e.g., a portion furthest from the object to be cooled) may be in contact with the vapor coolant. Liquid coolant may pool around the lower portion of the fins. The heat exchange unit may transfer thermal energy from the object to be cooled to the fins. The fins may transfer thermal energy to the coolant. As the coolant contacts the fins, it may evaporate to form a vapor coolant. The vapor coolant may flow along the long dimension of the fins (e.g., away from the surface of the heat exchange unit in thermal contact with the object to be cooled) to the coolant outlet. The fins may be shaped and/or disposed to distribute fluid throughout the cooling interface. For example, the fins may be disposed such that gaps between the fins permit coolant to flow. The fins may be spaced such that capillary action directs coolant away from a pool of liquid coolant and from the object to be cooled. As the coolant flows along the fin, it may undergo a phase transition from a liquid to a vapor coolant.

In an example, the cooling interface includes fins and no porous unit. In another example, the cooling interface includes a porous unit and no fins. In another example, the cooling unit includes both a porous unit and fins. The fins may be in thermal contact with or connected to a heat exchange unit (e.g., a heat spreader or heat sink). The cooling interface may further include on or more porous units. The one or more porous unit may be disposed between the fins, wrapped around the fins, or otherwise in contact with or in close proximity to the fins. In an example, the tins are columns or pins and the porous units are wrapped around the fins (e.g., are a sheath around the fins). In another example, the fins are plates disposed perpendicular to a surface of the heat exchange unit and the porous units are disposed between the plates (e.g., layers of porous units alternate with the fins. In an example, the length and height dimensions of the porous unit are larger than the length and height dimensions of the fins (e.g., the porous unit extends past the fins in one or more dimensions). The porous unit may wick (e.g., via capillary action) coolant along the height and length of the fins. The coolant may undergo a phase transition from a liquid to a vapor as it progresses along the height of the fins.

In an example, the cooling interface does not have fins and the porous unit is in contact with the heat exchange unit (e.g., heat spreader). The system may or may not include a porous unit. In a system without a porous unit, nucleation sites may occur on a surface of the heat exchange unit which, in turn, may reduce the rate of heat transfer and cooling. In a system with a porous unit, the porous unit may be in direct contact, partially or fully, with the heat exchange unit. Nucleation may preferentially occur in the porous unit such that the vapor is formed and directed away from a surface of the heat exchange unit, thereby increasing the rate of heat transfer and cooling.

In an example, the heat emitting object (e.g., source of thermal energy) is in direct contact with the coolant (e.g., is submerged in or surrounded by the coolant). The cooling interface may seal around the heat emitting object such that the system is a closed loop system (e.g., hermetically sealed from the ambient environment). The system may or may not include a porous unit. In a system without a porous unit, nucleation sites may occur on a surface of the heat emitting object which, in turn, may reduce the rate of heat transfer and cooling. In a system with a porous unit, the porous unit may be in direct contact, partially or fully, with the heat emitting object. Nucleation may preferentially occur in the porous unit such that the vapor is formed and directed away from a surface of the heat emitting object, thereby increasing the rate of heat transfer and cooling. The porous unit may direct liquid coolant along a surface of the heat emitting object and vapor coolant away from the heat emitting object.

The system may include a single controller or multiple controllers. For example, each component of the system (e.g., condenser, inlet shut-off valve, outlet shut-off valve, flow generator, etc.) may each be in communication with a single controller or a single controller may control more than one components of the system. In an example, a controller may control the inlet shut-off valve and the outlet shut-off valve. The controller may control each of the shut-off valves individually (e.g., the open/closed state of one valve does not affect the other) or simultaneously (e.g., the open/closed state of one valve is used to determine or affect the open/closed state of the other valve).

The method may be used to cool any type of heat source. For example, the cooling system may be used to cool a server room or farm, central processing unit (CPU), graphics processing unit (GPU), or any other electronic component which generates heat (e.g., a computer or any other electronic device).

The cooling interfaces may be in direct or indirect contact with the heat source. The heat source may be cooled by placing the cooling interfaces in direct or indirect contact (e.g., through a heat conductor) with the heat source.

The outlet and/or inlet shut-off valve may be a mechanical or electric valve. The outlet and/or inlet shut-off valve may be controlled by a control unit or may be physically controlled (e.g., by liquid coolant level). The outlet and/or inlet shut-off valve may be self-regulating. In an example, the system comprises an outlet shut-off valve and the outlet shut-off valve is a pressure relief valve that maintains the pressure of the cooling interface within a range, thereby maintaining the amount of coolant within the interface. In another example, the system further comprises an inlet shut-off valve that is a float valve designed to prevent liquid coolant from entering the associated cooling interface when the liquid coolant within the cooling interface unit reaches a predefined level/amount. For example, when the liquid level is below a threshold volume or level, the float valve may be in an open position and allow liquid coolant to flow into the cooling interface. When the liquid level reaches the threshold volume or level the float valve may be in a closed interface and prevent liquid coolant from flowing into the cooling interface. Using a pressure relief valve and/or a float valve may reduce the use of a flow generator to continuously flow the coolant through the cooling system which may reduce maintenance costs and redundant flow generators.

Each outlet and/or inlet shut-off valve may be in fluid communication with a single cooling interface. Alternatively, or in addition to, each outlet and/or inlet shut-off valve may in fluid communication with more than one cooling interface. An outlet and/or inlet shut-off valve may be in fluid communication with at least 2, 3, 4, 5, 6, 7, 8, 9, 10, or more cooling interfaces. The outlet and/or shut-off valves may be controlled as a group or may be individually controlled to permit fluid to enter the cooling interfaces. For example, outlet shut-off valves may be individually addressable.

The cooling system may have a single cooling interface or multiple cooling interfaces. The cooling system may have at least 2, 3, 4, 6, 8, 10, 20, 40, 60, 80, 100, or more cooling interfaces. The cooling system may include cooling interfaces connected in a parallel or series configuration. The cooling system may include at least one line or set of 2, 3, 4, 5, 6, 7, 8, 9, 10 or more cooling interface connected in a series configuration. Alternatively, or in addition to, the cooling system may have at least one line or set of 2, 3, 4, 5, 6, 7, 8, 9, 10 or more cooling interface connected in parallel. In an example, the cooling system comprises at least one line or set of 2, 3, 4, 5, 6, 7, 8, 9, 10 or more cooling interface connected both in series and in parallel. The cooling interfaces of the system may be grouped such that a single outlet and/or inlet shut-off valve controls the flow of liquid coolant to the group of cooling interfaces. The cooling system may have multiple groups of cooling interfaces, each in fluid communication with a single outlet and/or inlet shut-off valve. A group of cooling interfaces may include at least 2, 3, 4, 5, 6, 7, 8, 9, 10, or more cooling interfaces. A cooling system may include at least 2, 3, 4, 5, 6, 7, 8, 9, 10, 20, 30, 40, 50, or more groups of cooling interfaces.

The cooling system may be provided empty (e.g., without any coolant) and the method may include adding coolant to the system after installation of the cooling system. The coolant may include alcohol, water, glycol, a salt solution, or any combination thereof. The coolant or cooling agent may vaporize at less than or equal to about 1 atm at a temperature of less than 50° C. The coolant may vaporize at a pressure of less than or equal to about 1 atm and a temperature between about 0° C. to about 40° C., about 0° C. to about 30° C., about 0° C. to about 20° C., about 0° C. to about 10° C., about 5° C. to about 25° C., about 10° C. to about 25° C., about 15° C. to about 25° C., or from about 5° C. to about 20° C. The coolant or cooling agent may vaporize at 25° C. at a pressure of from about 0 atm to about 1 atm, from about zero atm to about 0.8 atm, from about zero atm to about 0.5 atm, from about zero atm to about 0.3 atm, or from about zero atm to about 0.1 atm.

The amount of heat dissipated by the system may be dependent upon the coolant used, the flow rate of the coolant, the area of the heat exchange unit, and the temperature differential between the coolant and the heat source. The cooling system may dissipate greater than or equal to about 50 watts per square centimeter (W/cm$^2$), 75 W/cm$^2$, 100 W/cm$^2$, 125 W/cm$^2$, 150 W/cm$^2$, 200 W/cm$^2$, 250 W/cm$^2$, 300 W/cm$^2$, 400 W/cm$^2$, 500 W/cm$^2$, or more. The temperature differential between the heat source and the coolant may be greater than or equal to about 1° C., 3° C., 5° C., 7° C., 10° C., 15° C., 20° C., 30° C., 40° C., 50° C., or more. The temperature differential between the heat source and the coolant may be less than or equal to about 50° C., 40° C., 30° C., 20° C., 15° C., 10° C., 7° C., 5° C., 3° C., 1° C., or less.

The cooling system and methods described herein may be used to cool any type of heat source. For example, the cooling system may be used to cool a server room or farm, central processing unit (CPU), graphics processing unit (GPU), or any other electronic component which generates heat (e.g., a computer or any other electronic device). The cooling system may be used to cool batteries (e.g., high capacity batteries for electric vehicles). The cooling system may be used to cool components during three-dimensional printing and other fabrication processes.

Computer Control Systems

Figure 6:
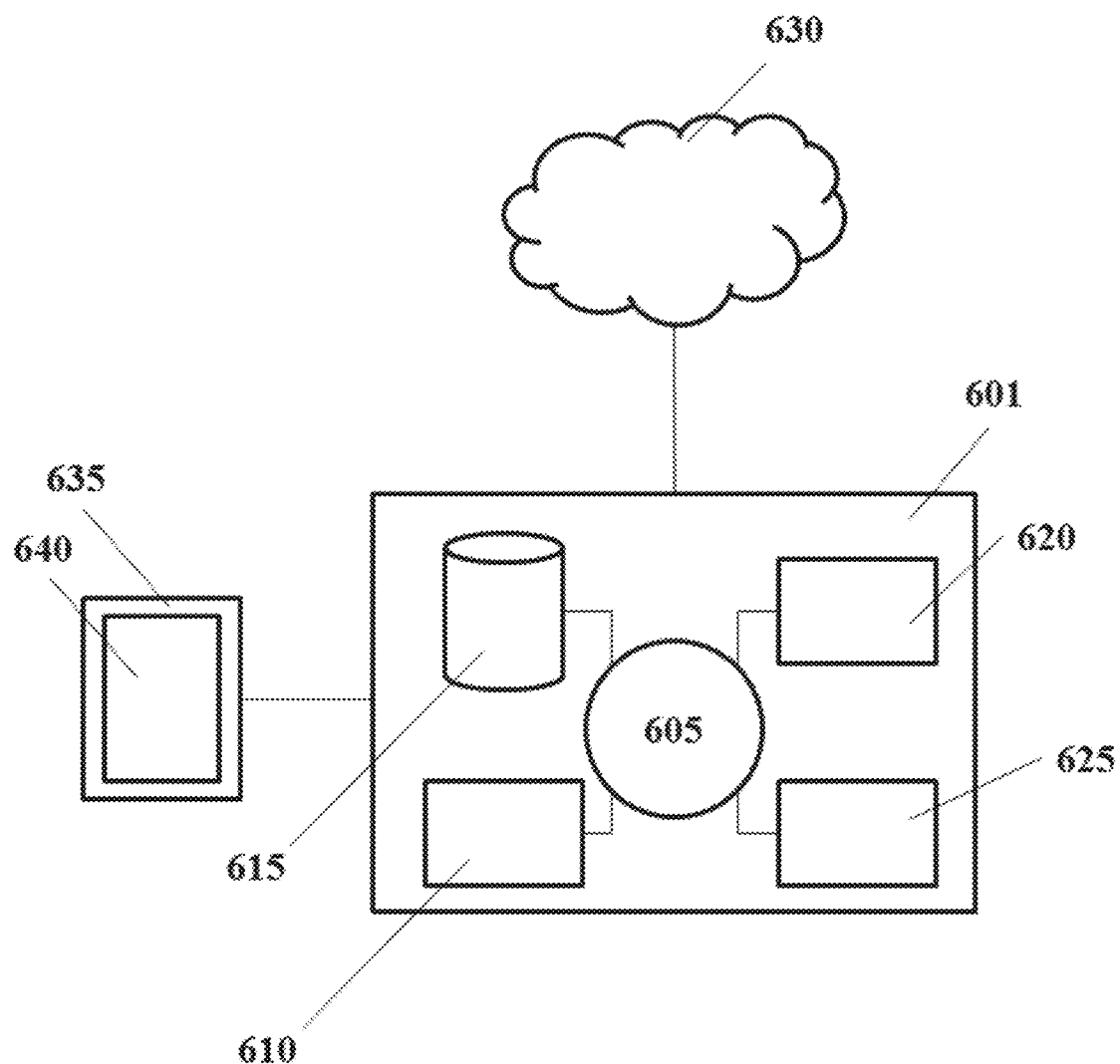
FIG. 6 shows a computer system that is programmed or otherwise configured to implement methods provided herein.

The present disclosure provides computer control systems that are programmed to implement methods of the disclosure. FIG. 6 shows a computer system 601 that is programmed or otherwise configured to monitor and control temperature. The computer system 601 can regulate various aspects of methods and systems of the present disclosure, such as, for example, controlling the flow of coolant through a cooling system to regulate temperature. The computer system 601 can be an electronic device of a user or a computer system that is remotely located with respect to the electronic device. The electronic device can be a mobile electronic device.

The computer system 601 includes a central processing unit (CPU, also "processor" and "computer processor" herein) 605, which can be a single core or multi core processor, or a plurality of processors for parallel processing. The computer system 601 also includes memory or memory location 610 (e.g., random-access memory, read-only memory, flash memory), electronic storage unit 615 (e.g., hard disk), communication interface 620 (e.g., network adapter) for communicating with one or more other systems, and peripheral devices 625, such as cache, other memory, data storage and/or electronic display adapters. The memory 610, storage unit 615, interface 620 and peripheral devices 625 are in communication with the CPU 605 through a communication bus (solid lines), such as a motherboard. The storage unit 615 can be a data storage unit (or data repository) for storing data. The computer system 601 can be operatively coupled to a computer network ("network") 630 with the aid of the communication interface 620. The network 630 can be the Internet, an internet and/or extranet, or an intranet and/or extranet that is in communication with the Internet. The network 630 in some cases is a telecommunication and/or data network. The network 630 can include one or more computer servers, which can enable distributed computing, such as cloud computing. The network 630, in some cases with the aid of the computer system 601, can implement a peer-to-peer network, which may enable devices coupled to the computer system 601 to behave as a client or a server.

The CPU 605 can execute a sequence of machine-readable instructions, which can be embodied in a program or software. The instructions may be stored in a memory location, such as the memory 610. The instructions can be directed to the CPU 605, which can subsequently program or otherwise configure the CPU 605 to implement methods of the present disclosure. Examples of operations performed by the CPU 605 can include fetch, decode, execute, and writeback.

The CPU 605 can be part of a circuit, such as an integrated circuit. One or more other components of the system 601 can be included in the circuit. In some cases, the circuit is an application specific integrated circuit (ASIC).

The storage unit 615 can store files, such as drivers, libraries and saved programs. The storage unit 615 can store user data, e.g., user preferences and user programs. The computer system 601 in some cases can include one or more additional data storage units that are external to the computer system 601, such as located on a remote server that is in communication with the computer system 601 through an intranet or the Internet.

The computer system 601 can communicate with one or more remote computer systems through the network 630. For instance, the computer system 601 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 601 via the network 630.

Methods as described herein can be implemented by way of machine (e.g., computer processor) executable code stored on an electronic storage location of the computer system 601, such as, for example, on the memory 610 or electronic storage unit 615. The machine executable or machine readable code can be provided in the form of software. During use, the code can be executed by the processor 605. In some cases, the code can be retrieved from the storage unit 615 and stored on the memory 610 for ready access by the processor 605. In some situations, the electronic storage unit 615 can be precluded, and machine-executable instructions are stored on memory 610.

The code can be pre-compiled and configured for use with a machine having a processor adapted to execute the code, or can be compiled during runtime. The code can be supplied in a programming language that can be selected to enable the code to execute in a pre-compiled or as-compiled fashion.

Aspects of the systems and methods provided herein, such as the computer system 601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to processor for execution.

The computer system 601 can include or be in communication with an electronic display 635 that comprises a user interface (UT) 640 for providing, for example, system and temperature information. Examples of s include, without limitation, a graphical user interface (GUI) and web-based user interface.

Methods and systems of the present disclosure can be implemented by way of one or more algorithms. An algorithm can be implemented by way of software upon execution by the central processing unit 605. The algorithm can, for example, regulate systems or implement methods provided herein.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. An evaporator device, comprising:
  a chamber comprising an inlet, an outlet, and a surface, wherein: said inlet comprises a one-directional inlet shut-off valve and is configured to direct a liquid coolant into said chamber, while preventing backflow of the liquid and generated vapor coolant, and said outlet comprises a one-directional outlet shut-off valve configured to direct only a vapor coolant away from said chamber while preventing exit of the liquid coolant out of the chamber, wherein said surface is in thermal communication with said liquid coolant or said vapor coolant, and wherein:
    said inlet shut-off valve and/or said outlet shut-off valve are self-regulating; and said inlet shut-off valve and outlet shut-off valve are designed to maintain a threshold or a residual amount of said liquid coolant within a cooling interface in said chamber, by allowing liquid coolant to enter through the inlet shut-off valve once the liquid coolant in said cooling interface has dropped below said threshold, and by allowing vapor coolant to exit through the outlet shut-off valve once the threshold level or residual amount has been reached; and
  a porous unit disposed adjacent to and in direct contact with said surface, wherein there is no space between the porous unit and said surface, wherein said porous unit is configured to (i) absorb said liquid coolant, (ii) bring said liquid coolant into thermal communication with said surface, (iii) subject said liquid coolant to a phase transition to a vapor coolant, and (iv) direct said vapor coolant away from said surface, wherein:
    said surface and said porous unit are of different materials;
    said porous unit is configured to form vapor nucleation sites at interface locations in which said porous unit contacts said surface; and
    said porous unit is thermally insulating having a thermal conductivity of less than or equal to 1 watt per meter-Kelvin (W/m-k), which is less than a thermal conductivity of said surface.

2. The evaporator device of claim 1, wherein said porous unit has pores with an average cross-sectional dimension of less than or equal to about 1000 micrometers.

3. The evaporator device of claim 1, wherein said porous unit is a multilayer porous unit, and wherein a layer of said multilayer porous unit has a different average cross-sectional dimension than another layer of said multilayer porous unit.

4. The evaporator device of claim 1, wherein said surface is a portion of a source of thermal energy, and wherein said porous unit contacts said portion of said source of thermal energy.

5. The evaporator device of claim 4, wherein said surface comprises a plurality of fins.

6. The evaporator device of claim 5, wherein said porous unit is disposed between said plurality of fins.

7. The evaporator device of claim 1, wherein said surface is a heat exchange unit, and wherein said heat exchange unit contacts a source of thermal energy.

8. The evaporator device of claim 7, wherein said surface comprises a plurality of fins.

9. The evaporator device of claim 8, wherein said porous unit is disposed between said plurality of fins.

* * * * *